(12) United States Patent
Jang et al.

(10) Patent No.: US 11,587,914 B2
(45) Date of Patent: Feb. 21, 2023

(54) LED CHIP AND MANUFACTURING METHOD OF THE SAME

(71) Applicant: SEOUL VIOSYS CO., LTD., Ansan-si (KR)

(72) Inventors: Jong Min Jang, Ansan-si (KR); Chang Yeon Kim, Ansan-si (KR); Myoung Hak Yang, Ansan-si (KR)

(73) Assignee: Seoul Viosys Co., Ltd., Ansan-si (KR)

( * ) Notice: Subject to any disclaimer, the term of this patent is extended or adjusted under 35 U.S.C. 154(b) by 0 days.

(21) Appl. No.: 16/852,522

(22) Filed: Apr. 19, 2020

(65) Prior Publication Data

US 2020/0365568 A1 Nov. 19, 2020

Related U.S. Application Data

(60) Provisional application No. 62/869,972, filed on Jul. 2, 2019, provisional application No. 62/847,852, filed on May 14, 2019.

(51) Int. Cl.
*H01L 25/075* (2006.01)
*H01L 33/62* (2010.01)
*H01L 27/15* (2006.01)
*H01L 23/31* (2006.01)

(52) U.S. Cl.
CPC ...... *H01L 25/0756* (2013.01); *H01L 23/3171* (2013.01); *H01L 27/153* (2013.01); *H01L 33/62* (2013.01)

(58) Field of Classification Search
None
See application file for complete search history.

(56) References Cited

U.S. PATENT DOCUMENTS

| 7,202,504 | B2 | 4/2007 | Ikeda et al. |
| 7,736,754 | B2 | 6/2010 | Kijima et al. |
| 2003/0213967 | A1* | 11/2003 | Forrest ............... H01L 51/5012 427/78 |
| 2006/0255343 | A1* | 11/2006 | Ogihara ............... H01L 24/24 257/82 |
| 2007/0069220 | A1* | 3/2007 | Ogihara ............ H01L 25/0756 257/E33.072 |

(Continued)

FOREIGN PATENT DOCUMENTS

| JP | 2006-173550 | 6/2006 |
| JP | 2012-033510 | 2/2012 |

OTHER PUBLICATIONS

International Search Report dated Aug. 21, 2020 issued to PCT/KR2020/006115.

(Continued)

*Primary Examiner* — Khaja Ahmad
(74) *Attorney, Agent, or Firm* — H.C. Park & Associates, PLC

(57) ABSTRACT

A light emitting chip including a first LED sub-unit, a second LED sub-unit disposed on the first LED sub-unit, a third LED sub-unit disposed on the second LED sub-unit, a passivation layer disposed on the third LED sub-unit, and a first connection electrode electrically connected to at least one of the first, second, and third LED sub-units, in which the first connection electrode and the third LED sub-unit form a first angle defined between an upper surface of the third LED sub-unit and an inner surface of the first connection electrode that is less than about 80°.

20 Claims, 18 Drawing Sheets

(56) References Cited

U.S. PATENT DOCUMENTS

| | | |
|---|---|---|
| 2007/0170444 A1 | 7/2007 | Cao |
| 2008/0251799 A1 | 10/2008 | Ikezawa |
| 2008/0308819 A1 | 12/2008 | Louwsma et al. |
| 2009/0078955 A1 | 3/2009 | Fan et al. |
| 2010/0051975 A1* | 3/2010 | Suzuki ............... H01L 25/0756 257/89 |
| 2013/0161628 A1 | 6/2013 | Suzuki et al. |
| 2014/0217438 A1 | 8/2014 | Tomizawa et al. |
| 2014/0284633 A1* | 9/2014 | Tsay .................... H01L 25/0756 257/88 |
| 2016/0163765 A1* | 6/2016 | Hu ....................... H01L 33/486 257/93 |
| 2017/0069681 A1 | 3/2017 | Lee et al. |
| 2017/0077367 A1 | 3/2017 | Shimojuku et al. |
| 2017/0309678 A1* | 10/2017 | Yang ...................... H01L 33/24 |
| 2019/0006413 A1 | 1/2019 | Jacob et al. |

OTHER PUBLICATIONS

Non-Final Office Action dated Dec. 21, 2021, in U.S. Appl. No. 16/848,914.
Non-Final Office Action dated Dec. 21, 2021, in U.S. Appl. No. 16/858,674.
Non-Final Office Action dated Dec. 21, 2021, in U.S. Appl. No. 16/849,842.
Final Office Action dated Jul. 21, 2022, in U.S. Appl. No. 16/858,674.
Final Office Action dated Aug. 3, 2022, in U.S. Appl. No. 16/848,914.
Final Office Action dated Aug. 4, 2022, in U.S. Appl. No. 16/849,842.
Non-Final Office Action dated Nov. 9, 2022, in U.S. Appl. No. 16/858,674.
Non-Final Office Action dated Dec. 13, 2022, in U.S. Appl. No. 16/848,914.
Non-Final Office Action dated Dec. 13, 2022, in U.S. Appl. No. 16/849,842.

* cited by examiner

LED CHIP AND MANUFACTURING METHOD OF THE SAME

CROSS-REFERENCE TO RELATED APPLICATIONS

This application claims the benefit of U.S. Provisional Application No. 62/847,852, filed on May 14, 2019, and U.S. Provisional Application No. 62/869,972, filed on Jul. 2, 2019, each of which is hereby incorporated by reference for all purposes as if fully set forth herein.

BACKGROUND

Field

Exemplary embodiments of the invention relate to a light emitting chip for a display and a manufacturing method of the same and, more specifically, to a micro light emitting chip having a stacked structure and a manufacturing method of the same.

Discussion of the Background

As an inorganic light source, light emitting diodes (LEDs) have been used in various technical fields, such as displays, vehicular lamps, general lighting, and the like. With advantages of long lifespan, low power consumption, and high response speed, light emitting diodes have been rapidly replacing an existing light source.

Light emitting diodes have been mainly used as backlight light sources in display apparatus. However, micro-LED displays have been recently developed that are capable of implementing an image directly using the light emitting diodes.

In general, a display apparatus implements various colors by using mixed colors of blue, green and, red light. The display apparatus includes pixels each having sub-pixels corresponding to blue, green, and red colors, and a color of a certain pixel may be determined based on the colors of the sub-pixels therein, and an image can be displayed through combination of the pixels.

Since LEDs can emit various colors depending upon its constituent materials, a display apparatus may typically have individual LED chips emitting blue, green, and red light arranged on a two-dimensional plane. However, when one LED chip is provided for each sub-pixel, the number of LED chips required to be mounted to form a display device becomes very large, e.g., over hundreds of thousands or millions, which may require a significant amount of time and complexity for the mounting process. Moreover, since the sub-pixels are arranged on the two-dimensional plane in a display apparatus, a relatively large area is required for one pixel including the sub-pixels for blue, green, and red light, and reducing the luminous area of each sub-pixel would deteriorate the brightness of the sub-pixels.

Moreover, micro-LEDs typically have a very small size with a surface area of about 10,000 square µm or less, and thus, various technical problems arise due to this small size. For example, an array of micro-LEDs is formed on a substrate, and the micro-LEDs may be singularized into each micro-LED chip by cutting the substrate. The individualized micro-LED chips may then be mounted on another substrate, such as a printed circuit board, during which various transferring technologies may be employed. However, during these transferring steps, handling of each micro-LED chip is generally difficult due to its small size and its vulnerable structure.

The above information disclosed in this Background section is only for understanding of the background of the inventive concepts, and, therefore, it may contain information that does not constitute prior art.

SUMMARY

Light emitting chips constructed according to the principles and some exemplary implementations of the invention are capable of protecting the light emitting stacked structures during various transferring processes.

Light emitting chips and a display using the same, e.g., micro-LEDs, constructed according to the principles and some exemplary implementations of the invention have a simplified structure that reduces the time for the mounting process during manufacture.

Additional features of the inventive concepts will be set forth in the description which follows, and in part will be apparent from the description, or may be learned by practice of the inventive concepts.

A light emitting chip according to an exemplary embodiment includes a first LED sub-unit, a second LED sub-unit disposed on the first LED sub-unit, a third LED sub-unit disposed on the second LED sub-unit, a passivation layer disposed on the third LED sub-unit, and a first connection electrode electrically connected to at least one of the first, second, and third LED sub-units, in which the first connection electrode and the third LED sub-unit form a first angle defined between an upper surface of the third LED sub-unit and an inner surface of the first connection electrode that is less than about 80°.

The first angle may be greater than about 60° and less than about 70°.

The passivation layer and the third LED sub-unit may form a second angle defined between the upper surface of the third LED sub-unit and an inner surface of the passivation layer that is less than about 80°.

The first connection electrode may have at least one surface having a curved shape.

The passivation layer may have a top surface facing away the third LED sub-unit and a side surface intersecting the top surface, and the first connection electrode may contact at least a portion of each of the top surface and the side surface of the passivation layer.

The first connection electrode may contact at least a portion of a top surface of the first LED sub-unit.

The first connection electrode may overlap at least a portion of each of the first, second, and third LED sub-units in a plan view.

At least a portion of the passivation layer may be exposed by the first connection electrode.

The passivation layer may expose at least a portion of a side surface of the first LED sub-unit.

The passivation layer may cover side surfaces of the second and third LED sub-units.

The passivation may expose at least a portion of a top surface of the first LED sub-unit.

The light emitting chip may further include a second connection electrode electrically connected to the first LED sub-unit, a third connection electrode electrically connected to the second LED sub-unit, and a fourth connection electrode electrically connected to the third LED sub-unit, in which the first connection electrode may be electrically connected to each of the first, second, and third sub-units, and each of the first, second, third, and fourth connection electrodes may have a curved shape.

Each of the first, second, third, and fourth connection electrodes may have a first portion disposed on a top surface of the passivation layer, and the passivation layer may not be disposed between the first portions of at least one of the first, second, third, and fourth connection electrodes.

The light emitting chip may further include a substrate, in which the first LED sub-unit may include a first LED light emitting stack, the second LED sub-unit may include a second LED light emitting stack, the third LED sub-unit may include a third LED light emitting stack, and the first, second, and third LED light emitting stacks may have successively smaller regions overlapping with the substrate.

At least one of the light emitting stacks may include a micro LED having a surface area less than about 10,000 square μm.

The passivation layer may have a substantially black color and include a photo-sensitive material.

A light emitting chip according to another exemplary embodiment includes a substrate having a substantially rectangular shape, a first LED sub-unit disposed on the substrate, a second LED sub-unit disposed on the first LED sub-unit, a third LED sub-unit disposed on the second LED sub-unit, a passivation layer disposed on the third LED sub-unit, and a first connection electrode electrically connected to at least one of the first, second, and third LED sub-units, in which the passivation layer exposes portions of the third LED sub-unit disposed around at least one corner of the substrate.

The first connection electrode may have a first portion contacting at least a portion of the first LED sub-unit and a second portion contacting at least a portion of a top surface of the passivation layer.

The first connection electrode and the substrate may form an angle defined between an upper surface of the third LED sub-unit and an inner surface of the first connection electrode that is less than about 80°.

The first connection electrode may be connected to each of the first, second, and third LED sub-units at one corner of the substrate exposed by the passivation layer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1A:
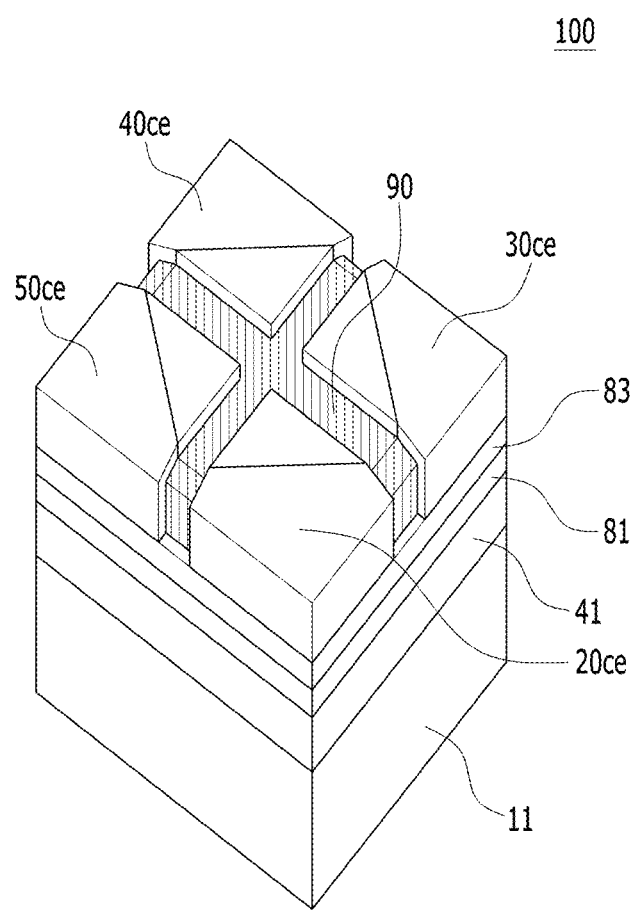
FIG. 1A is a schematic, perspective view of a light emitting chip constructed according to an exemplary embodiment of the invention.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Hereinafter, exemplary embodiments of the present disclosure will be described in detail with reference to the accompanying drawings. As used herein, a light emitting stacked structure, a light emitting chip, or a light emitting package according to exemplary embodiments may include a micro-LED, which has a surface area less than about 10,000 square μm as known in the art. In other exemplary embodiments, the micro-LED's may have a surface area less than about 4,000 square μm, or less than about 2,500 square μm, depending upon the particular application.

Figure 1B:
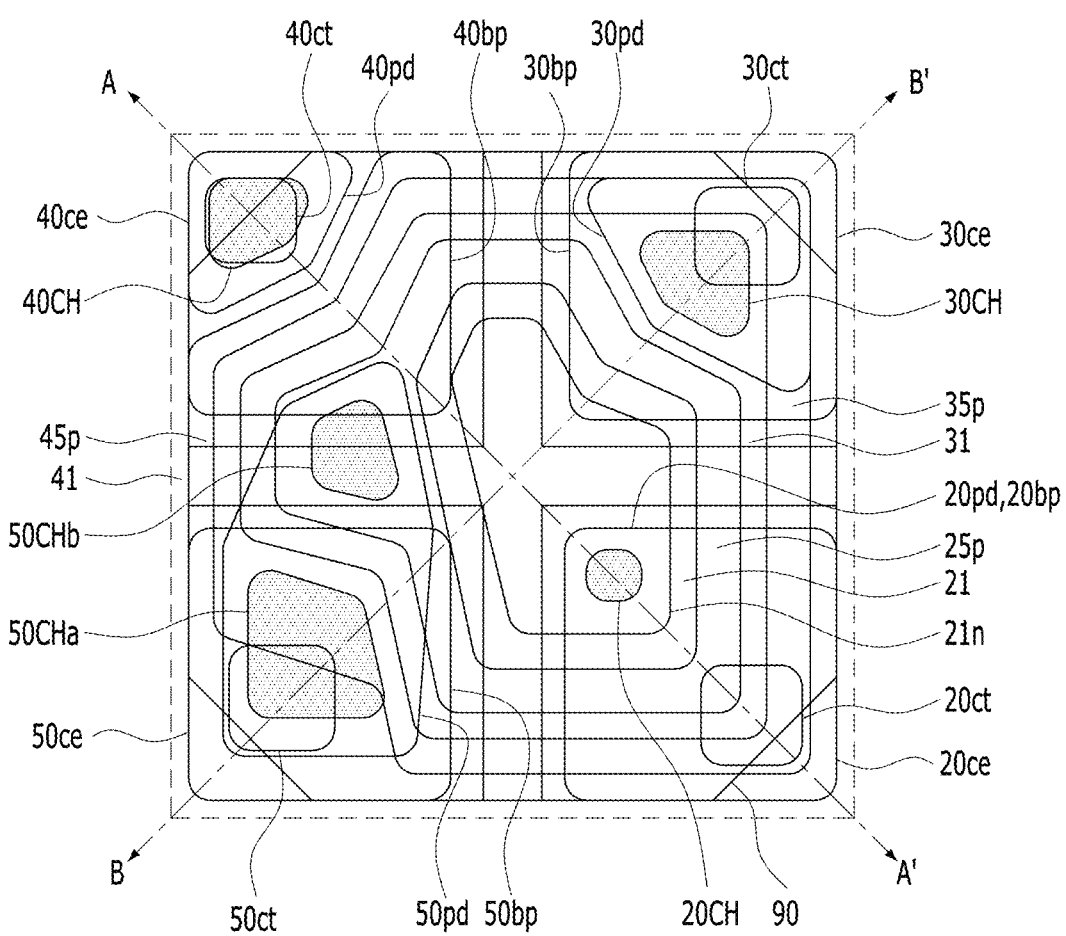
FIG. 1B is a plan view of the light emitting chip of FIG. 1A according to an exemplary embodiment showing underlying structures.
Figure 1C:
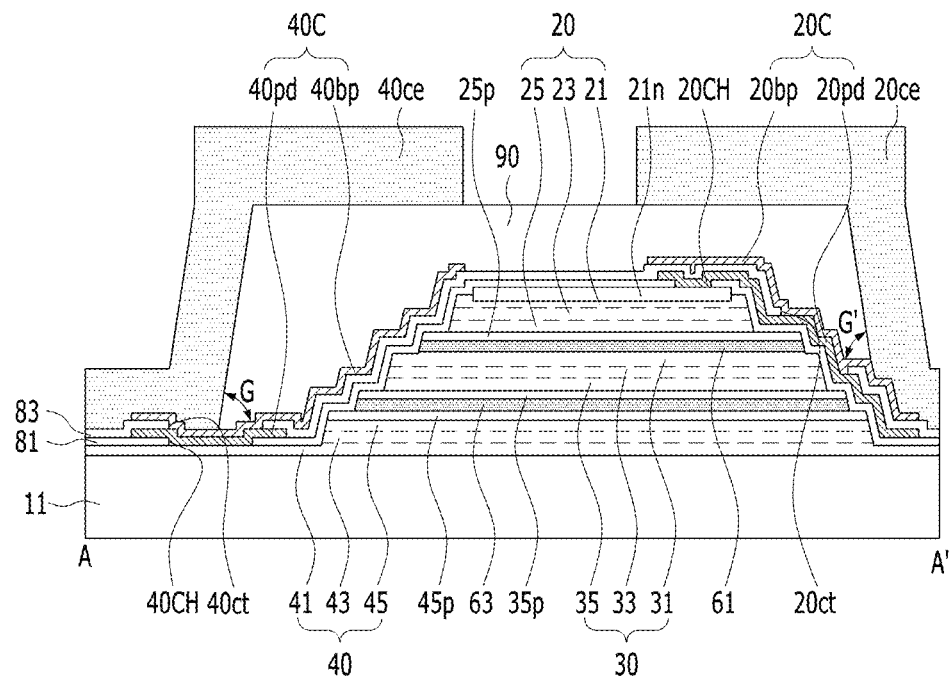
FIGS. 1C and 1D are cross-sectional views respectively taken along line A-A' and line B-B' of the light emitting chip of FIG. 1B according to an exemplary embodiment.
Figure 1D:
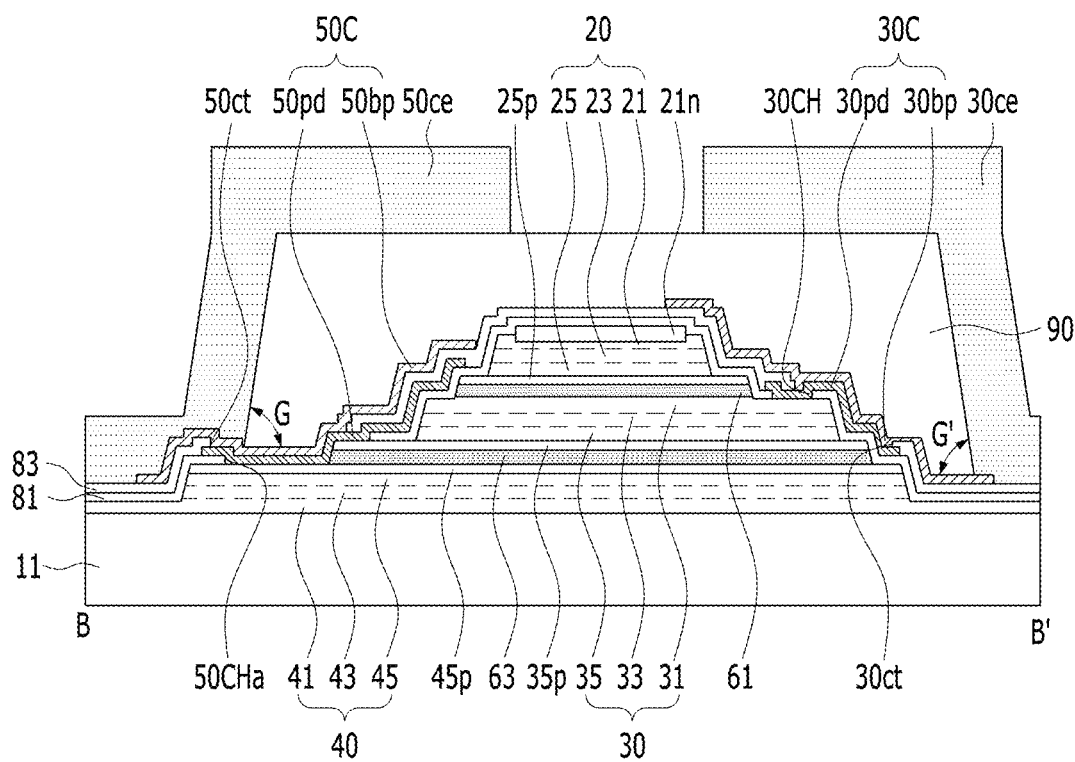
Figure 1E:
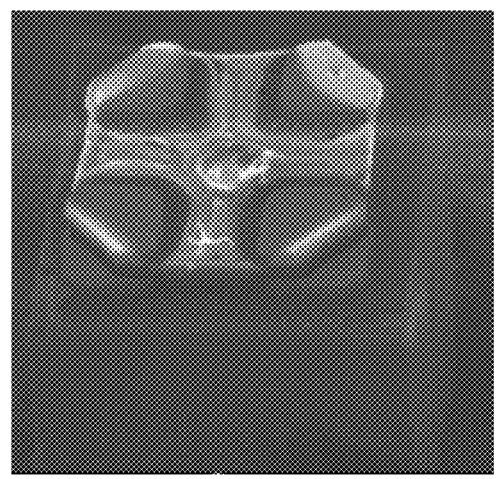
FIG. 1E is a SEM image of the light emitting chip of FIG. 1A according to an exemplary embodiment.

FIG. 1A is a schematic view of a light emitting chip constructed according to an exemplary embodiment of the invention. FIG. 1B is a perspective plan view of the light emitting chip of FIG. 1A according to an exemplary embodiment, FIGS. 1C and 1D are cross-sectional views respectively taken along line A-A' and line B-B' of the light emitting chip of FIG. 1B according to an exemplary embodiment, and FIG. 1E is a SEM image of the light emitting chip of FIG. 1A according to an exemplary embodiment.

Referring to FIGS. 1A and 1B, the light emitting chip 100 according to an exemplary embodiment includes a light emitting stacked structure, a first connection electrode 20ce, a second connection electrode 30ce, a third connection electrode 40ce, and a fourth connection electrode 50ce formed on the light emitting stacked structure, and a passivation layer 90 surrounding the connection electrodes 20ce, 30ce, 40ce, and 50ce. An array of the light emitting chips 100 may be formed on the substrate 11, and the light emitting chip 100 shown in FIG. 1A exemplarily shows one that has been singularized from the array, which will be described in more detail below. In some exemplary embodiments, the light emitting chip 100 including the light emitting stacked structure may be further processed to be formed as a light emitting package, which will be described in more detail later.

Referring to FIGS. 1A to 1D, the light emitting chip 100 according to the illustrated exemplary embodiment includes the light emitting stacked structure, which may include a first LED sub-unit, a second LED sub-unit, and a third LED sub-unit disposed on the substrate 11. The first LED sub-unit may include a first light emitting stack 20, the second LED sub-unit may include a second light emitting stack 30, and the third LED sub-unit may include a third light emitting stack 40. While the drawings show the light emitting stacked structure including three light emitting stacks 20, 30, and 40, the inventive concepts are not limited to a particular number of light emitting stacks formed in the light emitting stacked structure. For example, in some exemplary embodiments, the light emitting stacked structure may include two or more light emitting stacks therein. Hereinafter, the light emitting chip 100 will be described with reference to a light emitting stacked structure including three light emitting stacks 20, 30, and 40 according to an exemplary embodiment.

The substrate 11 may include a light transmitting insulating material to transmit light therethrough. In some exemplary embodiments, however, the substrate 11 may be formed to be semi-transparent to transmit only light having a specific wavelength, or formed to be partially transparent to transmit only a portion of light having the specific wavelength. The substrate 11 may be a growth substrate capable of epitaxially growing the third light emitting stack 40 thereon, such as a sapphire substrate. However, the inventive concepts are not limited thereto, and in some exemplary embodiments, the substrate 11 may include various other transparent insulating materials. For example, the substrate 11 may include a glass, a quartz, a silicon, an organic polymer, or an organic-inorganic composite material, such as silicon carbide (SiC), gallium nitride (GaN), indium gallium nitride (InGaN), aluminum gallium nitride (AlGaN), aluminum nitride (AlN), gallium oxide ($Ga_2O_3$), or silicon substrate. As another example, the substrate 11 in some exemplary embodiments may be a printed circuit board or a composite substrate including electrical lines therein for providing light emitting signals and a common voltage to each of the light emitting stacks formed thereon.

Each of the first, second, and third light emitting stacks 20, 30, and 40 is configured to emit light towards the substrate 11. As such, light emitted from the first light emitting stack 20, for example, may pass through the second and third light emitting stacks 30 and 40. According to an exemplary embodiment, light emitted from each of the first, second, and third light emitting stacks 20, 30, and 40 may have different wavelength bands from each other, and the light emitting stack that is disposed further away from the substrate 11 may emit light having a longer wavelength band. For example, the first, second, and third light emitting stacks 20, 30, and 40 may emit red light, green light, and blue light, respectively. However, the inventive concepts are not limited thereto. As another example, the first, second, and third light emitting stacks 20, 30, and 40 may emit red light, blue light, and green light, respectively. As still another example, in another exemplary embodiment, one or more of the light emitting stacks may emit light having substantially the same wavelength band. As still another example, when the light emitting stacked structure includes a micro-LED, which has a surface area less than about 10,000 square μm as known in the art, or less than about 4,000 square μm or 2,500 square μm in other exemplary embodiments, a light emitting stack that is disposed further away from the substrate 11 may emit light having a shorter wavelength band than light emitted from the one disposed closer to the substrate 11, without adversely affecting operation, due to the small form factor of a micro-LED. In this case, the micro-LED may be operated with low operating voltage, and thus, a separate color filter may not be required between the light emitting stacks. Hereinafter, the first, second, and third light emitting stacks 20, 30, and 40 will be exemplarily described as emitting red light, green light, and blue light, respectively, according to an exemplary embodiment.

The first light emitting stack 20 includes a first-type semiconductor layer 21, an active layer 23, and a second-type semiconductor layer 25. According to an exemplary embodiment, the first light emitting stack 20 may include a semiconductor material that emits red light, such as aluminum gallium arsenide (AlGaAs), gallium arsenide phosphide (GaAsP), aluminum gallium indium phosphide (AlGaInP), and gallium phosphide (GaP), without being limited thereto.

A first upper contact electrode 21n may be disposed on the first-type semiconductor layer 21 and form ohmic contact with the first-type semiconductor layer 21, and a first lower contact electrode 25p may be disposed under the second-type semiconductor layer 25 of the first light emitting stack 20. According to an exemplary embodiment, a portion of the first-type semiconductor layer 21 may be patterned, and the first upper contact electrode 21n may be disposed in the patterned area of the first-type semiconductor layer 21 to increase the level of ohmic contact therebetween. The first upper contact electrode 21n may have a single-layer structure or a multi-layered structure, and may include Al, Ti, Cr, Ni, Au, Ag, Sn, W, Cu, or an alloy thereof, such as Au—Te alloy or an Au—Ge alloy, without being limited thereto. In an exemplary embodiment, the first upper contact electrode 21n may have a thickness of about 100 nm, and include metal having high reflectance to increase light emission efficiency in a downward direction towards the substrate 11.

The second light emitting stack 30 includes a first-type semiconductor layer 31, an active layer 33, and a second-type semiconductor layer 35. According to an exemplary embodiment, the second light emitting stack 30 may include a semiconductor material that emits green light, such as indium gallium nitride (InGaN), gallium nitride (GaN), gallium phosphide (GaP), aluminum gallium indium phosphide (AlGaInP), and aluminum gallium phosphide (AlGaP), without being limited thereto. A second lower contact electrode 35p is disposed under the second-type semiconductor layer 35 of the second light emitting stack 30.

The third light emitting stack 40 includes a first-type semiconductor layer 41, an active layer 43, and a second-type semiconductor layer 45. According to an exemplary embodiment, the third light emitting stack 40 may include a semiconductor material that emits blue light, such as gallium nitride (GaN), indium gallium nitride (InGaN), and zinc selenide (ZnSe), without being limited thereto. A third lower contact electrode 45p is disposed on the second-type semiconductor layer 45 of the third light emitting stack 40.

According to an exemplary embodiment, each of the first-type semiconductor layers 21, 31, and 41 and each of the second-type semiconductor layers 25, 35, and 45 of the first, second, and third light emitting stacks 20, 30, and 40 may have a single-layer structure or a multi-layered structure, and in some exemplary embodiments, may include a superlattice layer. In addition, the active layers 23, 33, and 43 of the first, second, and third light emitting stacks 20, 30, and 40 may have a single quantum well structure or a multiple quantum well structure.

Each of the first, second, and third lower contact electrodes 25p, 35p, and 45p may include a transparent conductive material to transmit light. For example, the lower contact electrodes 25p, 35p, and 45p may include a transparent conductive oxide (TCO), such as tin oxide (SnO), indium oxide ($InO_2$), zinc oxide (ZnO), indium tin oxide (ITO), and indium tin zinc oxide (ITZO), without being limited thereto.

A first adhesive layer 61 is disposed between the first light emitting stack 20 and the second light emitting stack 30, and a second adhesive layer 63 is disposed between the second light emitting stack 30 and the third light emitting stack 40. The first and second adhesive layers 61 and 63 may include a non-conductive material that transmits light. For example, the first and second adhesive layers 61 and 63 may each include an optical clear adhesive (OCA), which may include epoxy, polyimide, SUB, spin-on glass (SOG), benzocyclobutene (BCB), or others, without being limited thereto.

According to the illustrated exemplary embodiment, a first insulating layer 81 and a second insulating layer 83 are disposed on at least a portion of side surfaces of the first, second, and third light emitting stacks 20, 30, and 40. At least one of the first and second insulating layers 81 and 83 may include various organic or inorganic insulating materials, such as polyimide, $SiO_2$, $SiN_x$, $Al_2O_3$ or the like. For example, at least one of the first and second insulating layers 81 and 83 may include a distributed Bragg reflector (DBR). As another example, at least one of the first and second insulating layers 81 and 83 may include a black-colored organic polymer. In some exemplary embodiments, a metal reflection layer that is electrically floated may be further disposed on the first and second insulating layers 81 and 83 to reflect light emitted from the light emitting stacks 20, 30, and 40 towards the substrate 11. In some exemplary embodiments, at least one of the first and second insulating layers 81 and 83 may have a single-layered or a multi-layered structure formed of two or more insulating layers having different refractive indices from each other.

According to an exemplary embodiment, each of the first, second, and third light emitting stacks 20, 30, and 40 may be driven independently. More particularly, one of the first and second-type semiconductor layers of each light emitting stack may be applied with a common voltage, and the other one of the first and second-type semiconductor layers of each light emitting stack may be applied with a respective light emitting signal. For example, according to the illustrated exemplary embodiment, the first-type semiconductor layers 21, 31, and 41 of each light emitting stack may be an n-type, and the second-type semiconductor layers 25, 35, and 45 of each light emitting stack may be a p-type. In this case, the third light emitting stack 40 may have a reversed stacked sequence as compared to the first and second light emitting stacks 20 and 30, such that the p-type semiconductor layer 45 is disposed on top of the active layer 43 to simplify the manufacturing process. Hereinafter, the first-type and second-type semiconductor layers may be interchangeably be referred to as p-type and n-type, respectively, according to the illustrated exemplary embodiment.

Each of the first, second, and third lower contact electrodes 25p, 35p, and 45p respectively connected to the p-type semiconductor layers 25, 35, and 45 of the light emitting stacks may be connected to a fourth contact part 50C, and the fourth contact part 50C may be connected to the fourth connection electrode 50ce to receive a common voltage from the outside. Meanwhile, the n-type semiconductor layers 21, 31, and 41 of the light emitting stacks may be connected to a first contact part 20C, a second contact part 30C, and a third contact part 40C, respectively, to receive corresponding light emitting signals via the first, second, and third connection electrodes 20ce, 30ce, and 40ce, respectively. In this manner, each of the first, second, and third light emitting stacks 20, 30, and 40 may be driven independently, while having a common p-type light emitting stacked structure.

While the light emitting chip 100 according to the illustrated exemplary embodiment has a common p-type structure, however, the inventive concepts are not limited thereto. For example, in some exemplary embodiments, the first-type semiconductor layers 21, 31, and 41 of each light emitting stack may be a p-type, and the second-type semiconductor layers 25, 35, and 45 of each light emitting stack may be an n-type to form a common n-type light emitting stacked structure. Furthermore, in some exemplary embodiments, the stacked sequence of each light emitting stack may be variously modified without being limited to that shown in the drawings. Hereinafter, the light emitting chip 100 according to the illustrated exemplary embodiment will be described with reference to the common p-type light emitting stacked structure.

According to the illustrated exemplary embodiment, the first contact part 20C includes a first pad 20pd and a first bump electrode 20bp electrically connected to the first pad 20pd. The first pad 20pd is disposed on the first upper contact electrode 21n of the first light emitting stack 20, and is connected to the first upper contact electrode 21n through a first contact hole 20CH defined through the first insulating layer 81. At least a portion of the first bump electrode 20bp may overlap with the first pad 20pd, and the first bump electrode 20bp is connected to the first pad 20pd through a first through-hole 20ct with the second insulating layer 83 interposed therebetween in an overlapping area between the first bump electrode 20bp and the first pad 20pd. In this case, the first pad 20pd and the first bump electrode 20bp may have substantially the same shape to overlap with each other, without being limited thereto.

The second contact part 30C includes a second pad 30pd and a second bump electrode 30bp electrically connected to the second pad 30pd. The second pad 30pd is disposed on the first-type semiconductor layer 31 of the second light emitting stack 30, and is connected to the first-type semiconductor layer 31 through a second contact hole 30CH defined through the first insulating layer 81. At least a portion of the second bump electrode 30bp may overlap with the second pad 30pd. The second bump electrode 30bp may be connected to the second pad 30pd through a second through hole 30ct with the second insulating layer 83 interposed therebetween in an overlapping area between the second bump electrode 30bp and the second pad 30pd.

The third contact part 40C includes a third pad 40pd and a third bump electrode 40bp electrically connected to the third pad 40pd. The third pad 40pd is disposed on the first-type semiconductor layer 41 of the third light emitting stack 40, and is connected to the first-type semiconductor layer 41 through a third contact hole 40CH defined through the first insulating layer 81. At least a portion of the third bump electrode 40bp may overlap with the third pad 40pd. The third bump electrode 40bp may be connected to the third pad 40pd through a third through hole 40ct with the second insulating layer 83 interposed therebetween in an overlapping area between the third bump electrode 40bp and the third pad 40pd.

The fourth contact part 50C includes a fourth pad 50pd and a fourth bump electrode 50bp electrically connected to the fourth pad 50pd. The fourth pad 50pd is connected to the second-type semiconductor layers 25, 35, and 45 of the first, second, and third light emitting stacks 20, 30, and 40 through a first sub-contact hole 50CHa and a second sub-contact hole 50CHb defined on the first, second, and third lower contact electrodes 25p, 35p, and 45p of the first, second, and third light emitting stacks 20, 30, and 40. In particular, the fourth pad 50pd is connected to the first lower contact electrode 25p through the second sub-contact hole 50CHb, and is connected to the second and third lower contact electrodes 35p and 45p through the first sub-contact hole 50CHa. In this manner, since the fourth pad 50pd can be connected to the second and third lower contact electrodes 35p and 45p through a single first sub-contact hole 50CHa, a manufacturing process of the light emitting chip 100 may be simplified, and an area occupied by the contact holes in the light emitting chip 100 may be reduced. At least a portion of the fourth bump electrode 50*bp* may overlap with the fourth pad 50*pd*. The fourth bump electrode 50*bp* is connected to the fourth pad 50*pd* through a fourth through hole 50*ct* with the second insulating layer 83 interposed therebetween in an overlapping area between the fourth bump electrode 50*bp* and the fourth pad 50*pd*.

According to an exemplary embodiment, the first, second, third, and fourth contact parts 20C, 30C, 40C, and 50C may be formed at various locations. For example, when the light emitting chip 100 has a substantially quadrangular shape as shown in the drawings, the first, second, third, and fourth contact parts 20C, 30C, 40C, and 50C may be disposed around each corner of the substantially quadrangular shape. However, the inventive concepts are not limited thereto, and in some exemplary embodiments, the light emitting chip 100 may be formed to have various shape, and the first, second, third, and fourth contact parts 20C, 30C, 40C, and 50C may be formed in other places depending on the shape of the light emitting device.

The first, second, third, and fourth pads 20*pd*, 30*pd*, 40*pd*, and 50*pd* are spaced apart from and insulated from each other. In addition, the first, second, third, and fourth bump electrodes 20*bp*, 30*bp*, 40*bp*, and 50*bp* are spaced apart from and insulated from each other. According to an exemplary embodiment, each of the first, second, third, and fourth bump electrodes 20*bp*, 30*bp*, 40*bp*, and 50*bp* may cover at least a portion of side surfaces of the first, second, and third light emitting stacks 20, 30, and 40, which may facilitate dissipation of heat generated from the first, second, and third light emitting stacks 20, 30, and 40 therethrough.

According to the illustrated exemplary embodiment, each of the connection electrodes 20*ce*, 30*ce*, 40*ce*, and 50*ce* may have curved (convex when viewed from above) shapes that project away from the substrate 11. More particularly, the connection electrodes 20*ce*, 30*ce*, 40*ce*, and 50*ce* may substantially cover at least the sides of the light emitting stacked structure, while exposing the passivation layer 90 between the connection electrodes 20*ce*, 30*ce*, 40*ce*, and 50*ce*. The connection electrodes 20*ce*, 30*ce*, 40*ce*, and 50*ce* may include metal, such as Cu, Ni, Ti, Sb, Zn, Mo, Co, Sn, Ag, or an alloy thereof, without being limited thereto. For example, in some exemplary embodiments, each of the connection electrodes 20*ce*, 30*ce*, 40*ce*, and 50*ce* may include two or more metals or a plurality of different metal layers to reduce the stress applied thereto. In another exemplary embodiment, when the connection electrodes 20*ce*, 30*ce*, 40*ce*, and 50*ce* include Cu, an additional metal may be deposited or plated thereon to suppress oxidation of Cu. In some exemplary embodiments, when the connection electrodes 20*ce*, 30*ce*, 40*ce*, and 50*ce* include Cu/Ni/Sn, Cu may prevent Sn from being infiltrating into the light emitting stacked structure. In some exemplary embodiments, the connection electrodes 20*ce*, 30*ce*, 40*ce*, and 50*ce* may include a seed layer for forming metal layer during a plating process, which will be described in more detail below.

As shown in the drawings, each of the connection electrodes 20*ce*, 30*ce*, 40*ce*, and 50*ce* may have a substantially flat upper surface to facilitate an electrical connection between the light emitting stacked structure with external lines or electrodes to be described later. According to an exemplary embodiment, when the light emitting chip 100 includes a micro-LED, which has a surface area less than about 10,000 square μm as known in the art, or less than about 4,000 square μm or 2,500 square μm in other exemplary embodiments, the connection electrodes 20*ce*, 30*ce*, 40*ce*, and 50*ce* may overlap a portion of at least one of the first, second, and third light emitting stacks 20, 30, and 40 as shown in the drawings. More particularly, the connection electrodes 20*ce*, 30*ce*, 40*ce*, and 50*ce* may overlap at least one step formed in a side surface of the light emitting stacked structure. In this manner, heat generated from the light emitting stacked structure may be more efficiently dissipated to the outside.

The connection electrodes 20*ce*, 30*ce*, 40*ce*, and 50*ce* may overlap a side surface of each of the light emitting stacks 20, 30, and 40, and may reflect light emitted from at least one or more light emitting stacks 20, 30, and 40, thereby improving light efficacy. Since the connection electrodes 20*ce*, 30*ce*, 40*ce*, and 50*ce* substantially cover at least the sides of the light emitting stacked structure, the light emitting chip 100 may be protected from external impact. According to the illustrated exemplary embodiment, a side surface of the connection electrodes 20*ce*, 30*ce*, 40*ce*, and 50*ce* may form an inclined angle G and G' with respect to the substrate 11, to improve the adhesiveness between the light emitting chip 100 and a molding layer 91 which is will be described in more detail later. In an exemplary embodiment, the angle G and G' formed between at least one of the connection electrodes 20*ce*, 30*ce*, 40*ce*, and 50*ce* and the substrate 11 may be less than about 80°, and in some exemplary embodiments, the inclined angle G and G' may be about 60° to about 70° with respect to the substrate 11.

In general, during manufacture, an array of a plurality of light emitting chips is formed on a substrate. The substrate may then be cut along scribing lines to singularize (to separate) each light emitting chip, and the light emitting chips may be transferred to another substrate or tape using various transferring technologies for further processing of the light emitting chips, such as packaging. In this case, when the light emitting chip includes connection electrodes, such as metal bumps or pillars that protrude outwardly from the light emitting structure, various problems may occur during subsequent processes, such as in the steps of transfer, due to the structure of the bare light emitting chip exposing the connection electrodes to the outside. Moreover, when the light emitting chips include a micro-LED, which has a surface area less than about 10,000 square μm, or less than about 4,000 square μm, or less than about 2,500 square μm, depending upon applications, handling of the light emitting chips may become more difficult due to its small form factor.

For example, when the connection electrodes have a substantially elongated shape, such as a bar, transferring the light emitting chips using a conventional vacuum method becomes difficult as the light emitting chip may not have sufficient suction area due to the protruding structure of the connection electrodes. Furthermore, the exposed connection electrodes may be directly impacted with various stresses during subsequent processes, such as when the connection electrodes contact a manufacturing device, which may cause damage to the structure of the light emitting chip. As another example, when the light emitting chip is transferred using a conventional pick-and-place method, an ejection pin may directly contact a portion of the light emitting chip disposed between the connection electrodes, and damage a top structure of the light emitting structure. In particular, the ejection pin may strike a center of the light emitting chip, and cause physical damage to the top light emitting stack of the light emitting chip. Such impact by the ejection pin to the light emitting chip is shown in FIG. 1E, where the center of the light emitting chip 100 is indented by the ejection pin.

According to the illustrated exemplary embodiment, the third and fourth connection electrodes 40*ce* and 50*ce* are shown as being asymmetrical to the first and second connection electrodes 20ce and 30ce. More particularly, each of the connection electrodes 20ce, 30ce, 40ce and 50ce may have a portion that does not overlap the passivation layer 90, and FIGS. 1C and 1D, for example, show that those of the third and fourth connection electrodes 40ce and 50ce to be greater in area than those of the first and second connection electrodes 20ce and 30ce near two opposing ends of the substrate 11. However, the inventive concepts are not limited thereto, and in some exemplary embodiments, each of the connection electrodes 20ce, 30ce, 40ce and 50ce may be symmetrical to each other. For example, a portion of each of the connection electrodes 20ce, 30ce, 40ce and 50ce that does not overlap the passivation layer 90 may have the same area as each other.

According to an exemplary embodiment, the passivation layer 90 may be formed on the light emitting stacked structure. More particularly, as shown in FIG. 1A, the passivation layer 90 may be formed between the connection electrodes 20ce, 30ce, 40ce, and 50ce, and cover at least the sides of the light emitting stacked structure. According to the illustrated exemplary embodiment, the passivation layer 90 may expose side surfaces of the substrate 11, first and second insulating layers 81 and 83, and the third light emitting stack 40. The passivation layer 90 may include an epoxy molding compound (EMC), which may be formed in various colors, such as black or transparent. However, the inventive concepts are not limited thereto. For example, in some exemplary embodiments, the passivation layer 90 may include a polyimide (PID), and in this case, the PID may be provided as a dry film rather than a liquid type to increase the level of flatness when applied to the light emitting stacked structure. In some exemplary embodiments, the passivation layer 90 may include a material that has photosensitivity. In this manner, the passivation layer 90 may protect the light emitting structure from an external impact that may be applied during subsequent processes, as well as providing a sufficient contact area to the light emitting chip 100 to facilitate its handling during subsequent transferring steps. In addition, the passivation layer 90 may prevent leakage of light towards a side surface of the light emitting chip 100, so as to prevent or at least suppress interference of light emitted from adjacent light emitting chips 100. According to an exemplary embodiment, side surfaces of the passivation layer 90 may be inclined, such that the connection electrodes 20ce, 30ce, 40ce, and 50ce formed thereon may have a curved shape, respectively.

Figure 2:
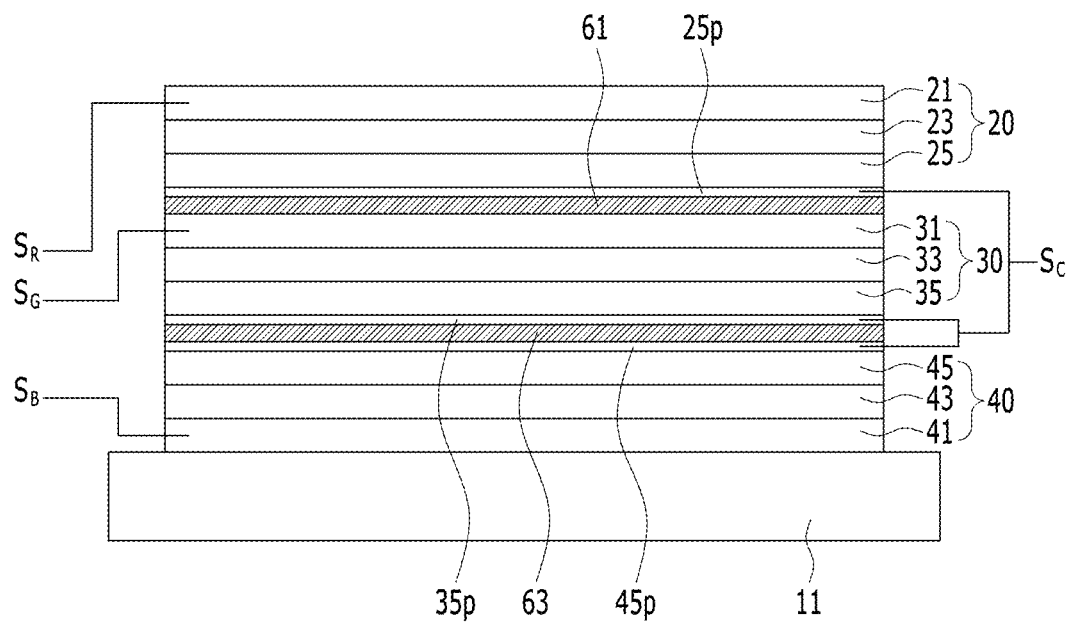
FIG. 2 is a schematic cross-sectional view of a light emitting stacked structure constructed according to an exemplary embodiment.

FIG. 2 is a schematic cross-sectional view of a light emitting stacked structure according to an exemplary embodiment. The light emitting stacked structure according to the illustrated exemplary embodiment is substantially the same as that included in the light emitting chip 100 described above, and thus, repeated descriptions of substantially the same elements forming the light emitting stacked structure will be omitted to avoid redundancy.

Referring to FIG. 2, the first, second, and third lower contact electrodes 25p, 35p, and 45p according to an exemplary embodiment may be connected to a common line, to which the common voltage Sc is applied. Light emitting signal lines $S_R$, $S_G$, and $S_B$ may be respectively connected to the first-type semiconductor layers 21, 31, and 41 of the first, second, and third light emitting stacks 20, 30, and 40. In this case, the light emitting signal line is connected to the first-type semiconductor layer 21 of the first light emitting stack 20 through the first upper contact electrode 21n. In the illustrated exemplary embodiment, a common voltage Sc is applied to the first, second, and third lower contact electrodes 25p, 35p, and 45p through the common line, and the light emitting signal is respectively applied to the first-type semiconductor layers 21, 31, and 41 of the first, second, and third light emitting stacks 20, 30, and 40 through the light emitting signal lines. In this manner, the first, second, and third light emitting stacks 20, 30, and 40 may be individually controlled to selectively emit light.

Although FIG. 2 shows the light emitting stacked structure having the p-common structure, however, the inventive concepts are not limited thereto. For example, in some exemplary embodiments, the common voltage Sc may be applied to the first-type (or n-type) semiconductor layers 21, 31, and 41 of the first, second, and third light emitting stacks 20, 30, and 40, and the light emitting signal may be applied to the second-type (or p-type) semiconductor layers 25, 35, and 45 of the first, second, and third light emitting stacks 20, 30, and 40.

The light emitting stacked structure according to an exemplary embodiment may display various colors of light depending on the operating status of each light emitting stack 20, 30, and 40, whereas a conventional light emitting device may display various colors by a combination of multiple light emitting cells emitting a single color of light. More particularly, a conventional light emitting device generally includes light emitting cells that respectively emit different color of light, e.g., red, green, and blue, which are spaced apart from each other along a two dimensional plane, to implement a full color display. As such, a relatively large area may be occupied by the conventional light emitting cells. The light emitting stacked structure according to an exemplary embodiment, however, can emit different color of light by stacking a plurality of light emitting stacks 20, 30, 40, thereby providing a high level of integration and implementing the full color through a significantly smaller area than that in the conventional light emitting device.

In addition, when the light emitting chips 100 are mounted to another substrate to manufacture a display device, for example, the number of chips to be mounted may be significantly reduced as compared to the conventional light emitting devices due to its stacked structure. As such, a manufacture of the display device that employs the light emitting chip 100 may be substantially simplified, especially when hundreds of thousands or millions of pixels are formed in one display device.

According to an exemplary embodiment, the light emitting stacked structure may further include various additional components to improve the purity and efficiency of light emitted therefrom. For example, in some exemplary embodiments, a wavelength pass filter may be formed between adjacent light emitting stacks to prevent or at least suppress light having a shorter wavelength from traveling towards a light emitting stack emitting a longer wavelength. In addition, in some exemplary embodiments, concave-convex portions may be formed on a light emitting surface of at least one of the light emitting stacks to balance the brightness of light between the light emitting stacks. For example, as green light generally has a higher visibility than red light and blue light, in some exemplary embodiments, the concave-convex portions may be formed on the light emitting stacks emitting red light or blue light to improve light efficiency thereof, thereby balancing the visibility between light emitted from the light emitting stacks.

Hereinafter, a method of forming the light emitting chip 100 will be described with reference to the drawings according to an exemplary embodiment.

FIGS. 3A, 4A, 5A, 6A, 7A, 8A, 9A, and 10A are plan views illustrating a process of manufacturing the light emitting chip of FIG. 1A according to an exemplary embodiment. FIGS. 3B, 4B, 5B, 6B, 7B, 8B, 9B, and 10B are cross-sectional views taken along line A-A' of its corresponding plan view shown in FIGS. 3A, 4A, 5A, 6A, 7A, 8A, 9A, and 10A according to an exemplary embodiment.

Referring back to FIG. 2, the first-type semiconductor layer 41, the third active layer 43, and the second-type semiconductor layer 45 of the third light emitting stack 40 may be sequentially grown on the substrate 11 by a metal organic chemical vapor deposition (MOCVD) method or a molecular beam epitaxy (MBE) method, for example. The third lower contact electrode 45$p$ may be formed on the third p-type semiconductor layer 45 by a chemical vapor deposition method, for example, and may include a transparent conductive oxide (TCO), such as tin oxide (SnO), indium oxide (InO$_2$), zinc oxide (ZnO), indium tin oxide (ITO), indium tin zinc oxide (ITZO) or the like. When the third light emitting stack 40 emits blue light according to an exemplary embodiment, the substrate 11 may include Al$_2$O$_3$ (e.g., sapphire substrate), and the third lower contact electrode 45$p$ may a transparent conductive oxide (TCO), such as tin oxide (SnO), indium oxide (InO$_2$), zinc oxide (ZnO), indium tin oxide (ITO), indium tin zinc oxide (ITZO) or the like. The first and second light emitting stacks 20 and 30 may be similarly formed by sequentially growing the first-type semiconductor layer, the active layer, and the second-type semiconductor layer on a temporary substrate, respectively, and the lower contact electrode including a transparent conductive oxide (TCO) may be respectively formed on the second-type semiconductor layer by a chemical vapor deposition method or the like, for example. Then, the first and second light emitting stacks 20 and 30 may be adjoined to each other with the first adhesive layer 61 interposed therebetween, and at least one of the temporary substrates of the first and second light emitting stacks 20 and 30 may be removed by a laser lift off process, chemical process, mechanical process, or the like, for example. In this case, in some exemplary embodiments, a concave-convex portions may be formed on the exposed light emitting stack to improve light efficiency. Then, the first and second light emitting stacks 20 and 30 may be adjoined with the third light emitting stack 40 with the second adhesive layer 63 interposed therebetween, and the remaining one of the temporary substrates of the first and second light emitting stacks 20 and 30 may be removed by a laser lift off process, chemical process, mechanical process, or the like, for example. In this case, in some exemplary embodiments, a concave-convex portions may be formed on the remaining exposed light emitting stack to improve light efficiency. In this manner, the light emitting stacked structure shown in FIG. 2 may be formed.

Figure 3A:
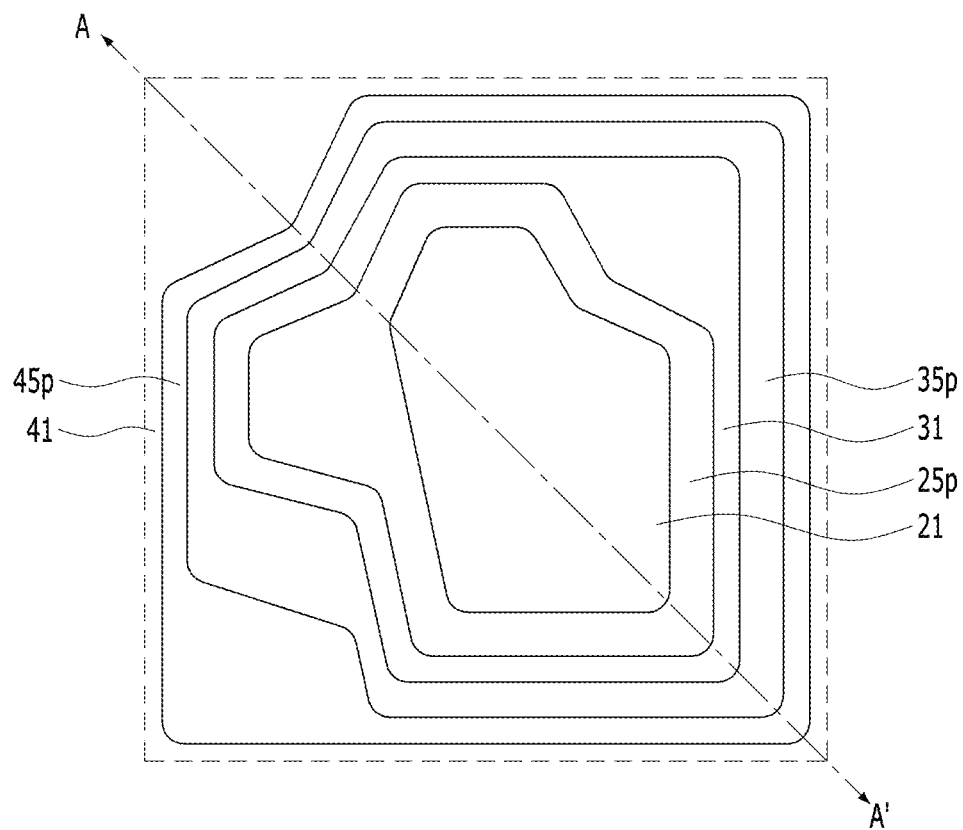
FIGS. 3A, 4A, 5A, 6A, 7A, 8A, 9A, and 10A are plan views illustrating a process of manufacturing the light emitting chip of FIG. 1A according to an exemplary embodiment.
Figure 3B:
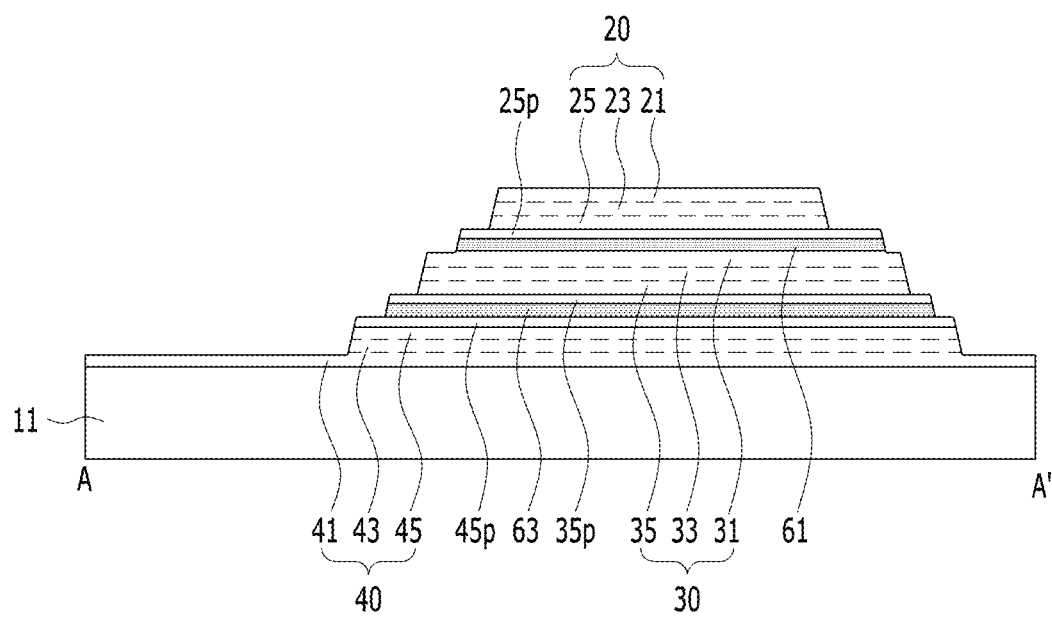
FIGS. 3B, 4B, 5B, 6B, 7B, 8B, 9B, and 10B are cross-sectional views taken along line A-A' of its corresponding plan view shown in FIGS. 3A, 4A, 5A, 6A, 7A, 8A, 9B, and 10B according to an exemplary embodiment.

Referring to FIGS. 3A and 3B, various portions of each of the first, second, and third light emitting stacks 20, 30, and 40 may be patterned via etching process or the like to expose portions of the first-type semiconductor layer 21, first lower contact electrode 25$p$, first-type semiconductor layer 31, second lower contact electrode 35$p$, third lower contact electrode 45$p$, and first-type semiconductor layer 41. According to the illustrated exemplary embodiment, the first light emitting stack 20 has the smallest area among the light emitting stacks 20, 30, and 40. However, the inventive concepts are not limited to relative sizes of the light emitting stacks 20, 30, and 40.

Figure 4A:
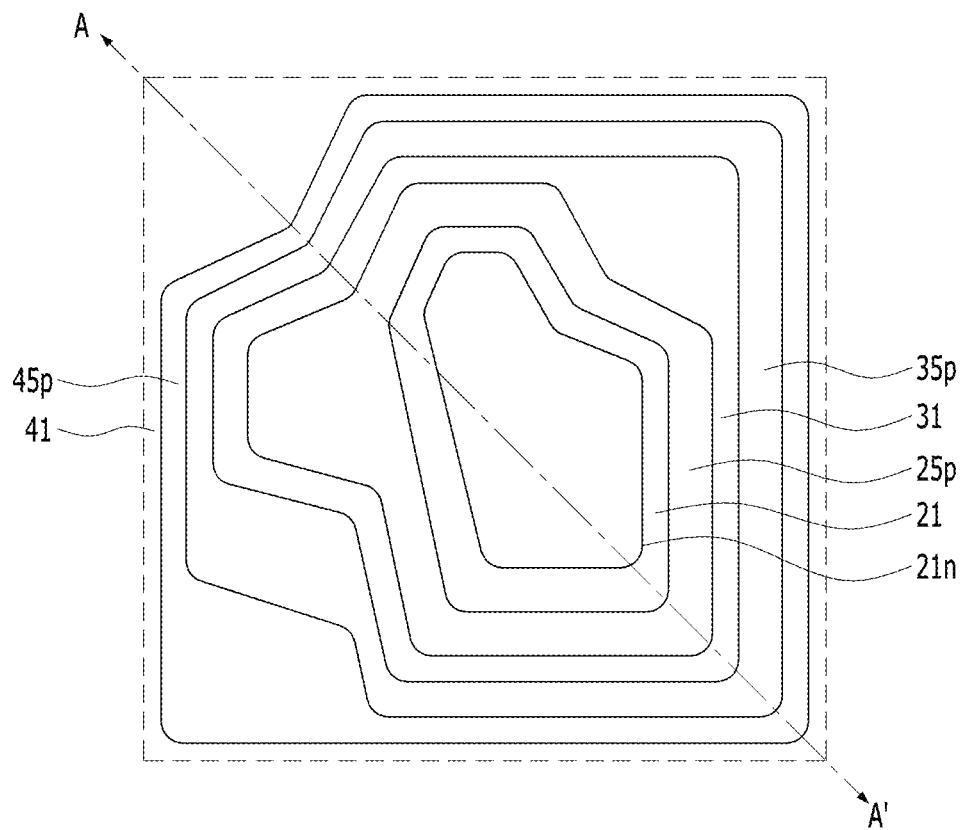
Figure 4B:
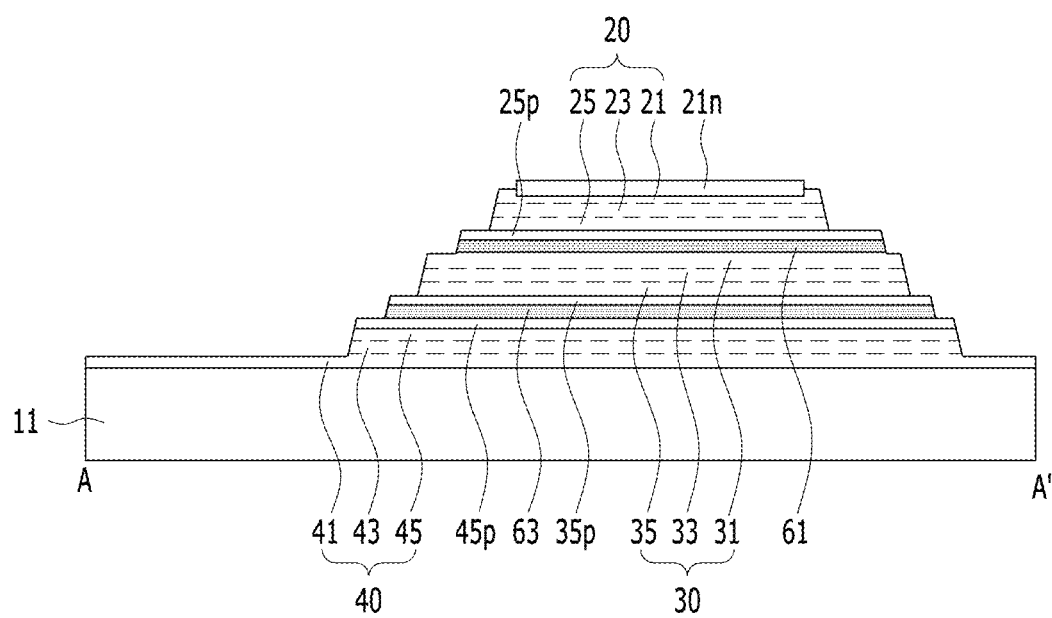

Referring to FIGS. 4A and 4B, a portion of a top surface of the first-type semiconductor layer 21 of the first light emitting stack 20 may be patterned, such as via wet-etching, at which the first upper contact electrode 21$n$ may be formed. As described above, the first upper contact electrode 21$n$ may be formed in the patterned area of the first-type semiconductor layer 21 with a thickness of about 100 nm, for example, to improve ohmic contact therebetween.

Figure 5A:
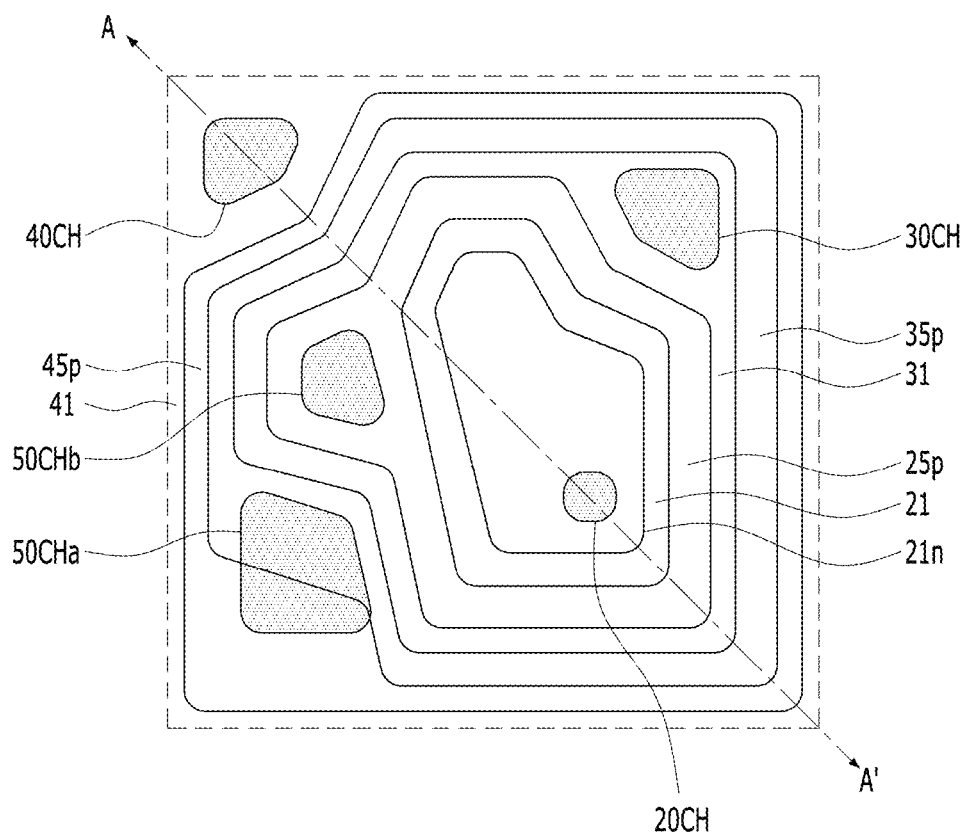
Figure 5B:
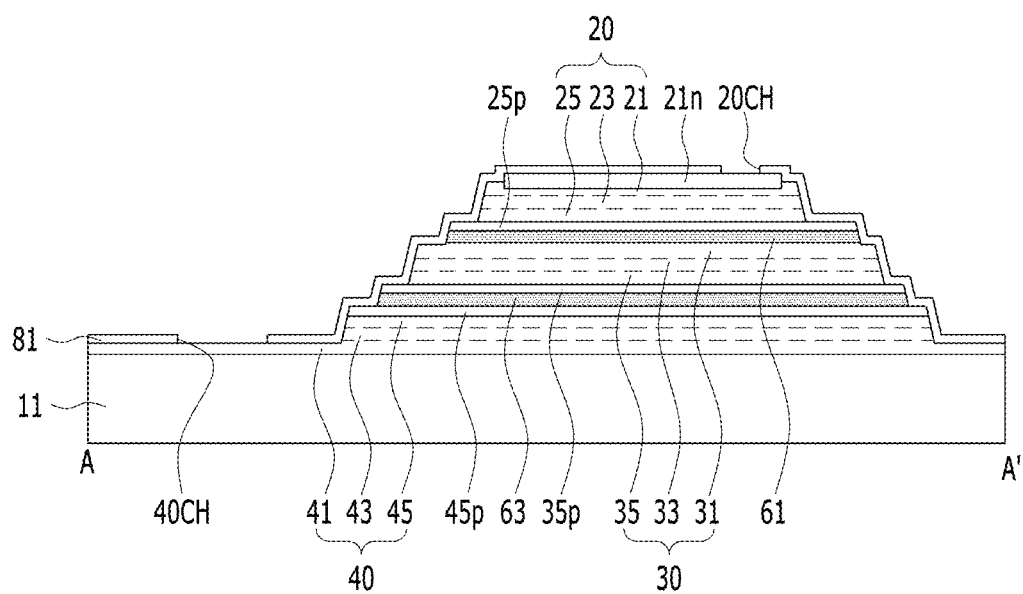

Referring to FIGS. 5A and 5B, the first insulating layer 81 may be formed to cover the light emitting stacks 20, 30, and 40, and portions of the first insulating layer 81 may be removed to form the first, second, third, and fourth contact holes 20CH, 30CH, 40CH, and 50CH. The first contact hole 20CH is defined on the first n-type contact electrode 21$n$ to expose a portion of the first n-type contact electrode 21$n$.

The second contact hole 30CH may expose a portion of the first-type semiconductor layer 31 of the second light emitting stack 30. The third contact hole 40CH may expose a portion of the first-type semiconductor layer 41 of the third light emitting stack 40. The fourth contact hole 50CH may expose portions of the first, second, and third lower contact electrodes 21$p$, 31$p$, and 41$p$. The fourth contact hole 50CH may include the first sub-contact hole 50CHa exposing a portion of the first lower contact electrode 25$p$ and the second sub-contact hole 50CHb exposing the second and third lower contact electrodes 35$p$ and 45$p$. In some exemplary embodiments, however, a single first sub-contact hole CH may expose each of the first, second, and third lower contact electrodes 21$p$, 31$p$, and 41$p$.

Figure 6A:
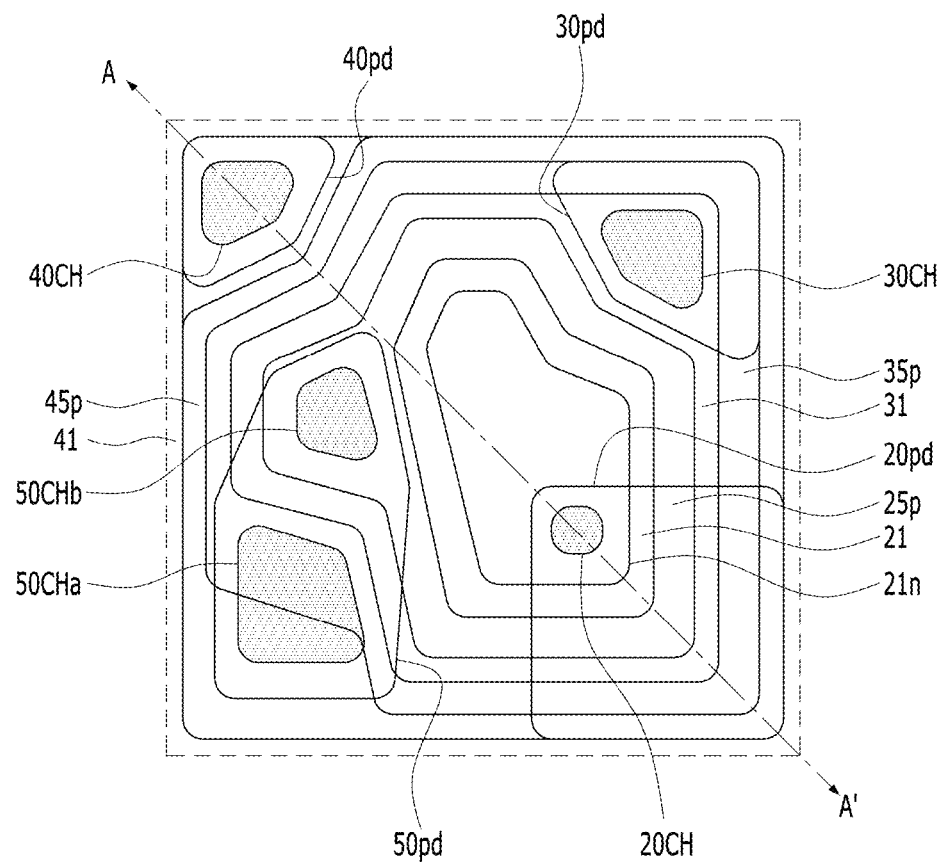
Figure 6B:
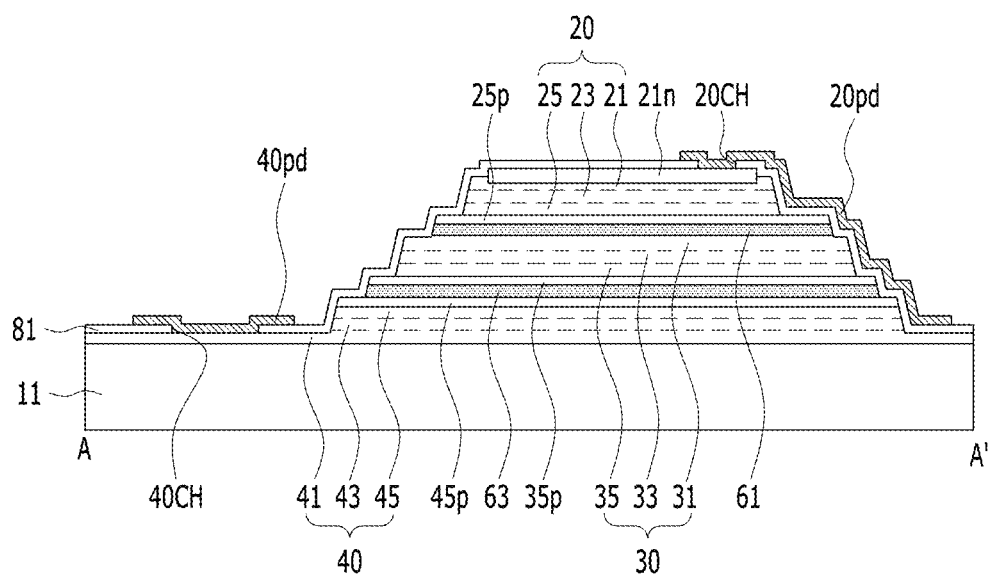

Referring to FIGS. 6A and 6B, the first, second, third, and fourth pads 20$pd$, 30$pd$, 40$pd$, and 50$pd$ are formed on the first insulating layer 81 formed with the first, second, third, and fourth contact holes 20CH, 30CH, 40CH, and 50CH. The first, second, third, and fourth pads 20$pd$, 30$pd$, 40$pd$, and 50$pd$ may be formed by, for example, forming a conductive layer on substantially the entire surface of the substrate 11, and patterning the conductive layer using a photolithography process or the like.

The first pad 20$pd$ is formed to overlap an area where the first contact hole 20CH is formed, such that the first pad 20$pd$ may be connected to the first upper contact electrode 21$n$ of the first light emitting stack 20 through the first contact hole 20CH. The second pad 30$pd$ is formed to overlap an area where the second contact hole 30CH is formed, such that the second pad 30$pd$ may be connected to the first-type semiconductor layer 31 of the second light emitting stack 30 through the second contact hole 30CH. The third pad 40$pd$ is formed to overlap an area where the third contact hole 40CH is formed, such that the third pad 40$pd$ may be connected to the first-type semiconductor layer 41 of the third light emitting stack 40 through the third contact hole 40CH. The fourth pad 50$pd$ is formed to overlap with an area where the fourth contact hole 50CH is formed, more particularly, where the first and second sub-contact holes 50CHa and 50CHb are formed, such that the fourth pad 50$pd$ may be connected to the first, second, and third lower contact electrodes 25$p$, 35$p$, and 45$p$ of the first, second, and third light emitting stacks 20, 30, and 40 through the first and second sub-contact holes 50CHa and 50CHb.

Figure 7A:
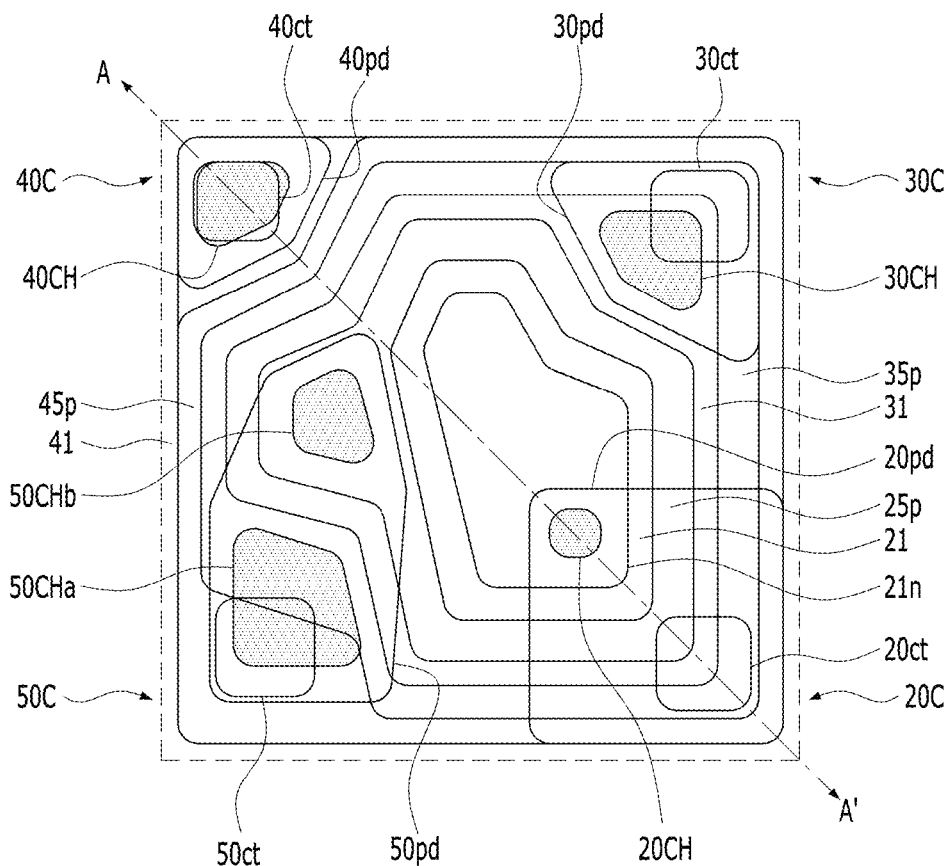
Figure 7B:
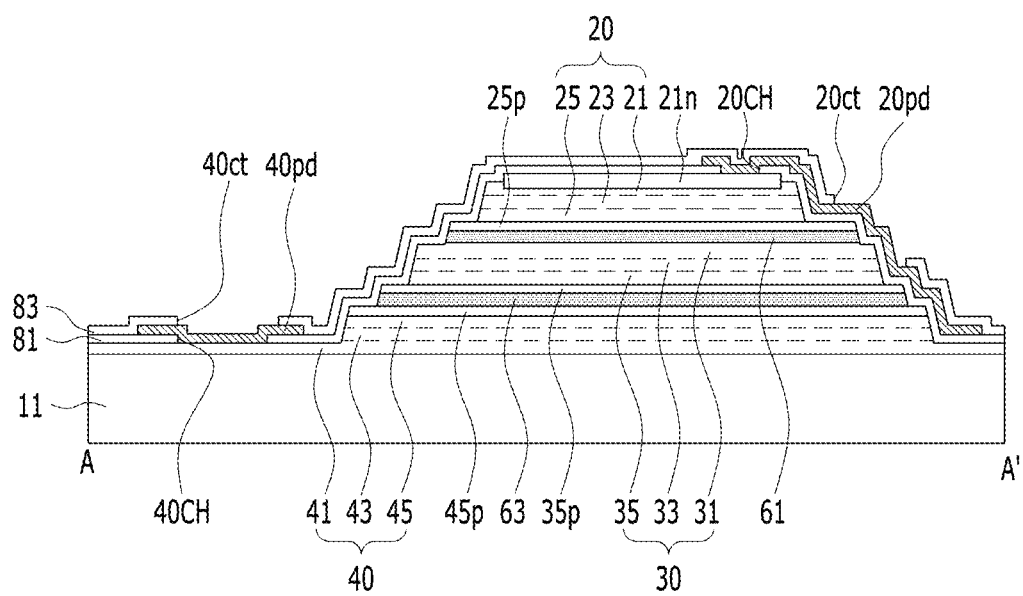

Referring to FIGS. 7A and 7B, the second insulating layer 83 may be formed on the first insulating layer 81. The second insulating layer 83 may include silicon oxide and/or silicon nitride. However, the inventive concepts are not limited thereto, and in some exemplary embodiments, the first and second insulating layers 81 and 83 may include an inorganic material. The second insulating layer 83 is then patterned and to form the first, second, third, and fourth through holes 20$ct$, 30$ct$, 40$ct$, and 50$ct$ therein.

The first through hole 20$ct$ formed on the first pad 20$pd$ exposes a portion of the first pad 20$pd$. The second through hole 30*ct* formed on the second pad 30*pd* exposes a portion of the second pad 30*pd*. The third through hole 40*ct* formed on the third pad 40*pd* exposes a portion of the third pad 40*pd*. The fourth through hole 50*ct* formed on the fourth pad 50*pd* exposes a portion of the fourth pad 50*pd*. In the illustrated exemplary embodiment, the first, second, third, and fourth through holes 20*ct*, 30*ct*, 40*ct*, and 50*ct* may be respectively defined in areas where the first, second, third, and fourth pads 20*pd*, 30*pd*, 40*pd*, and 50*pd* are formed.

Figure 8A:
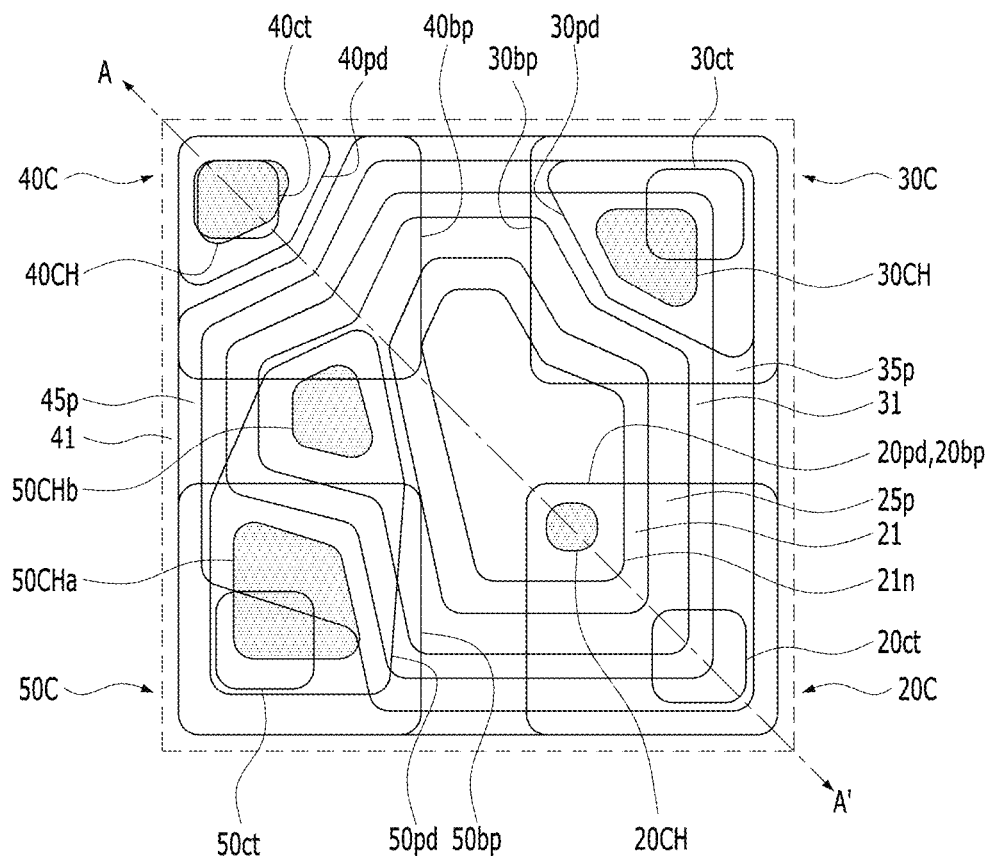
Figure 8B:
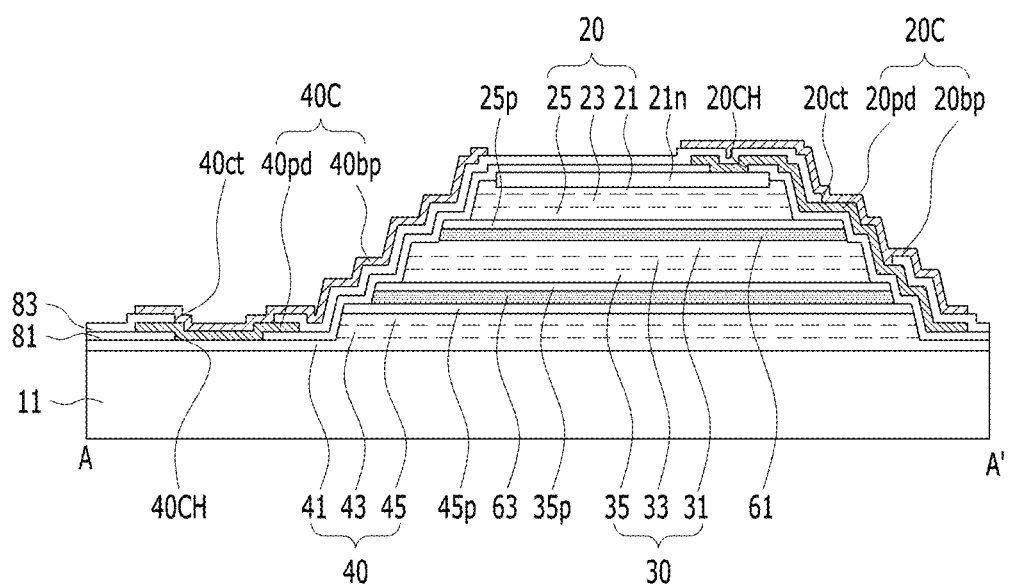

Referring to FIGS. 8A and 8B, the first, second, third, and fourth bump electrodes 20*bp*, 30*bp*, 40*bp*, and 50*bp* are formed on the second insulating layer 83 formed with the first, second, third, and fourth through holes 20*ct*, 30*ct*, 40*ct*, and 50*ct*. The first bump electrode 20*bp* is formed to overlap an area where the first through hole 20*ct* is formed, such that the first bump electrode 20*bp* may be connected to the first pad 20*pd* through the first through hole 20*ct*. The second bump electrode 30*bp* is formed to overlap an area where the second through hole 30*ct* is formed, such that the second bump electrode 30*bp* may be connected to the second pad 30*pd* through the second through hole 30*ct*. The third bump electrode 40*bp* is formed to overlap an area where the third through hole 40*ct* is formed, such that the third bump electrode 40*bp* may be connected to the third pad 40*pd* through the third through hole 40*ct*. The fourth bump electrode 50*bp* is formed to overlap with an area where the fourth through hole 50*ct* is formed, such that the fourth bump electrode 50*bp* is connected to the fourth pad 50*pd* through the fourth through hole 50*ct*. The first, second, third, and fourth bump electrodes 20*bp*, 30*bp*, 40*bp*, and 50*bp* may be formed by depositing a conductive layer on the substrate 11, and patterning the conductive layer, for example, which may include at least one of Ni, Ag, Au, Pt, Ti, Al, and Cr, or the like.

Figure 9A:
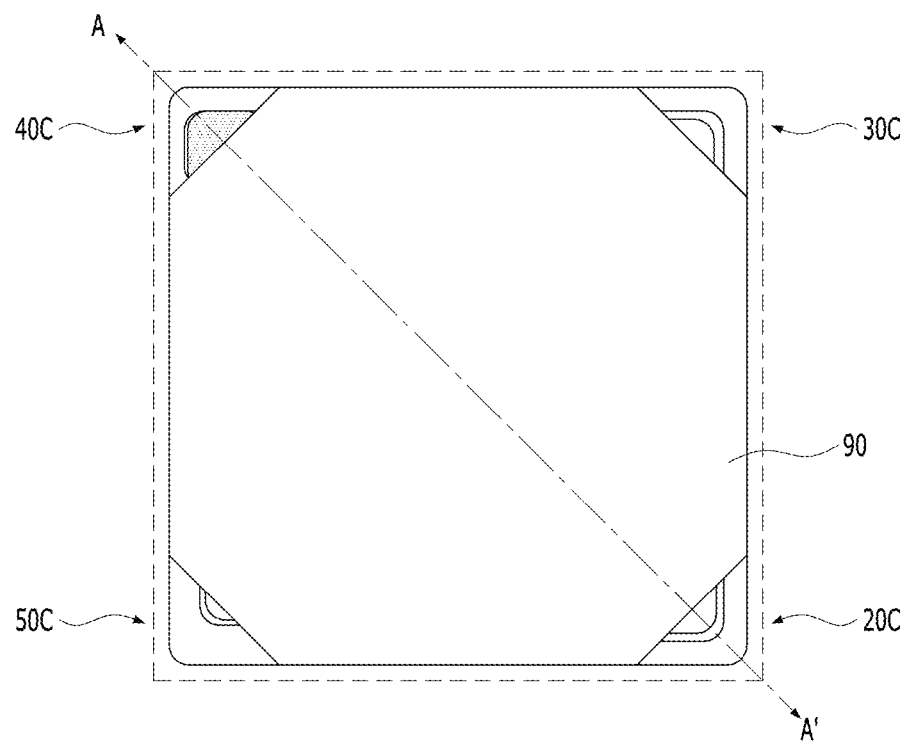
Figure 9B:
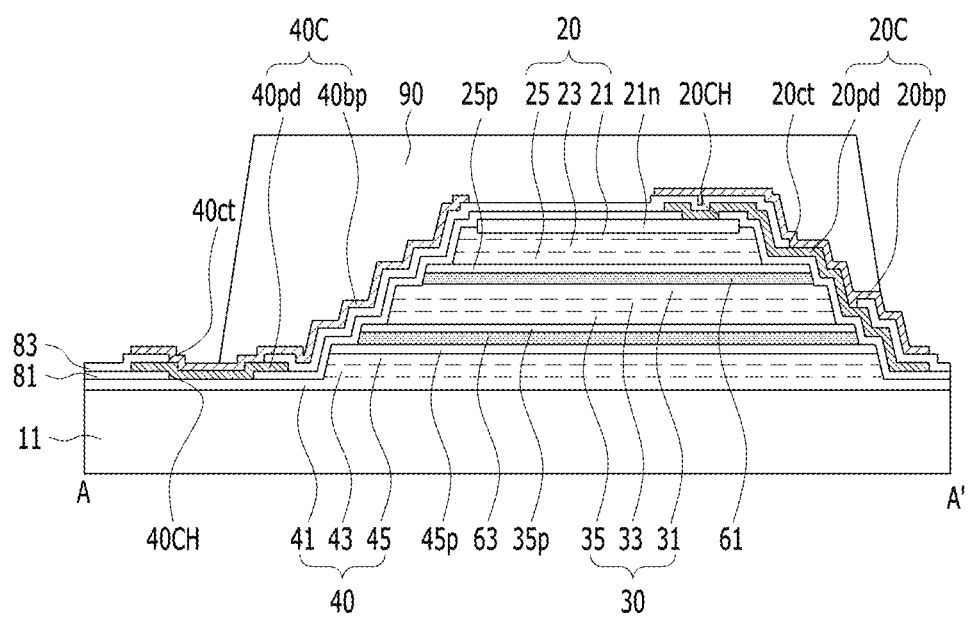

Referring to FIGS. 9A and 9B, the passivation layer 90 is formed on the light emitting stacked structure. As described above, the passivation layer 90 according to an exemplary embodiment may include an epoxy molding compound (EMC), which may be formed in various colors, such as black or transparent. However, the inventive concepts are not limited thereto, and in some exemplary embodiments, the passivation layer 90 may include a polyimide (PID), and in this case, the PID may be provided as a dry film rather than a liquid type to increase the level of flatness when applied to the light emitting stacked structure. In some exemplary embodiments, the passivation layer 90 may include a material that has photosensitivity.

According to an exemplary embodiment, a layer forming the passivation layer 90, such as the one that includes a PID, may be deposited on substantially the entire outer surfaces of the light emitting stacked structure. The layer then may be patterned, such as via a lithography process, to expose at least a portion of each of the first bump electrode 20*bp*, second bump electrode 30*bp*, third bump electrode 40*bp*, and fourth bump electrode 50*bp*, to which the connection electrodes 20*ce*, 30*ce*, 40*ce*, and 50*ce* are connected to, respectively. The drawings show that the passivation layer 90 exposes each corner of the light emitting chip 100 in a plan view, however, the inventive concepts are not limited thereto. For example, the passivation layer 90 may expose various other portions of the light emitting chip 100, as long as at least portions of the first bump electrode 20*bp*, second bump electrode 30*bp*, third bump electrode 40*bp*, and fourth bump electrode 50*bp* are exposed by the passivation layer 90.

The passivation layer 90 may cover an upper surface of the light emitting stacked structure, such that the light emitting stacked structure, especially the first light emitting stack 20 disposed on the top of the structure, may be protected from external stress during manufacture. According to the illustrated exemplary embodiment, the passivation layer 90 may form an inclined angle G and G' (see FIGS. 1C and 1D) with respect to the substrate 11. For example, the angle G and G' formed between the passivation layer 90 and the substrate may be less than about 80°. When the inclined angle G and G' is greater than about 80°, the passivation layer 90 may not sufficiently cover steps formed on side surfaces of the light emitting stacked structure. In some exemplary embodiments, the inclined angle G and G' between the passivation layer 90 and the substrate 11 may be greater than about 60° and less than about 70°. In this manner, the connection electrodes 20*ce*, 30*ce*, 40*ce*, and 50*ce* to be formed on the passivation layer 90 may also be stably formed on the light emitting stacked structure. In addition, an edge between a top surface and a side surface of the passivation layer 90 may form a smooth angle, such that the connection electrodes 20*ce*, 30*ce*, 40*ce*, and 50*ce* to be formed thereon may have a substantially uniform thickness. However, the inventive concepts are not limited to, and in some exemplary embodiments, a substantially sharp edge may be formed between a top surface and a side surface of the passivation layer 90.

Figure 10A:
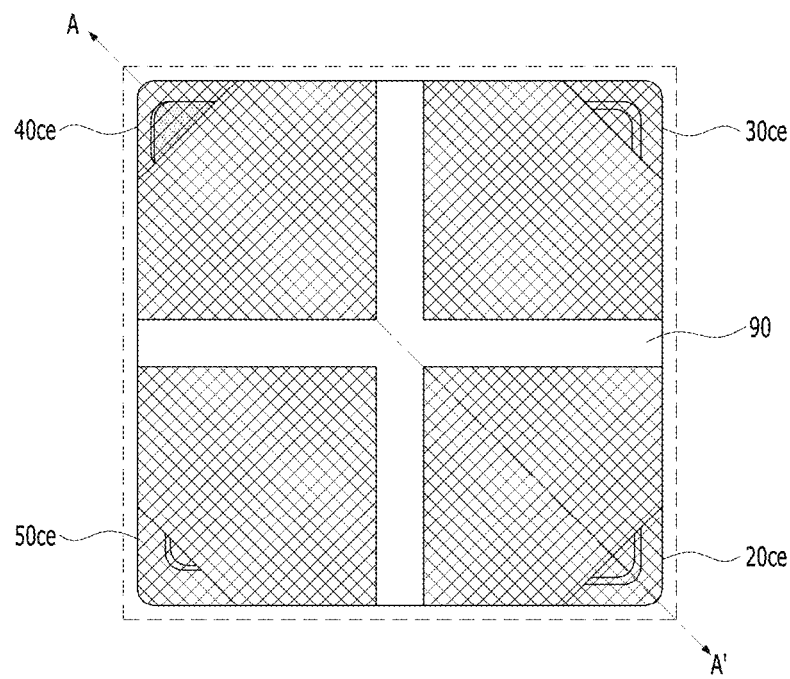
Figure 10B:
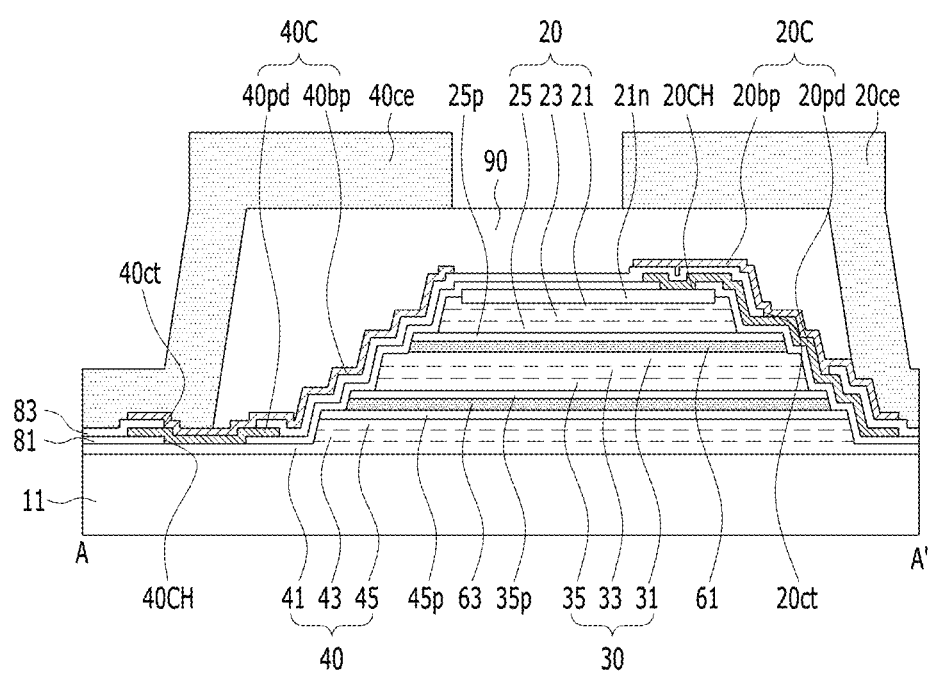

Referring to FIGS. 10A and 10B, the first, second, third, and fourth connection electrodes 20*ce*, 30*ce*, 40*ce*, and 50*ce* spaced apart from each other are formed on the passivation layer 90. Referring back to FIGS. 1B to 1D, the first, second, third, and fourth connection electrodes 20*ce*, 30*ce*, 40*ce*, and 50*ce* may be electrically connected to the first, second, third, and fourth bump electrodes 20*bp*, 30*bp*, 40*bp*, and 50*bp*, respectively, to transmit an external signal to each of the light emitting stacks 20, 30, and 40. More particularly, according to the illustrated exemplary embodiment, the first connection electrode 20*ce* may be connected to the first bump electrode 20*bp*, which is connected to the first upper contact electrode 21*n* through the first pad 20*pd*, to be electrically connected to the first-type semiconductor layer 21 of the first light emitting stack 20. The second connection electrode 30*ce* may be connected to the second bump electrode 30*bp*, which is connected to the second pad 30*pd*, to be electrically connected to the first-type semiconductor layer 31 of the second light emitting stack 30. The third connection electrode 40*ce* may be connected to the third bump electrode 40*bp*, which is connected to the third pad 40*pd*, to be electrically connected to the first-type semiconductor layer 41 of the third light emitting stack 40. The fourth connection electrode 50*ce* may be connected to the fourth bump electrode 50*bp*, which is connected to the fourth pad 50*pd*, to be electrically connected to the second-type semiconductor layers 25, 35, and 45 of the light emitting stacks 20, 30, and 40 via the first, second, and third lower contact electrodes 25*p*, 35*p*, and 45*p*, respectively.

A method of forming the first, second, third, and fourth connection electrodes 20*ce*, 30*ce*, 40*ce*, and 50*ce* is not particularly limited. For example, according to an exemplary embodiment, a conductive layer to be formed as the first, second, third, and fourth connection electrodes 20*ce*, 30*ce*, 40*ce*, and 50*ce* may be deposited on the passivation layer 90, and the conductive layer may be patterned by using a photo-lithography or the like, such that each of the conductive layers overlaps a portion of the first bump electrode 20*bp*, second bump electrode 30*bp*, third bump electrode 40*bp*, and fourth bump electrode 50*bp* exposed by the passivation layer 90, respectively. The conductive layer (e.g., connection electrodes) according to an exemplary embodiment may include metal, such as Cu, Ni, Ti, Sb, Zn, Mo, Co, Sn, Ag, or an alloy thereof. In this case, a separate plating process may be omitted. In some exemplary embodiments, an additional metal may be deposited on the conductive layer, by an electroless nickel immersion gold (ENIG) or the like, to prevent or at least suppress oxidation of the connection electrodes 20ce, 30ce, 40ce, and 50ce.

According to the illustrated exemplary embodiment, each of the connection electrodes 20ce, 30ce, 40ce, and 50ce may have a curved shape that protrudes away from the substrate 11 to substantially cover the light emitting stacked structure and the passivation layer 90. As shown in the drawings, each of the connection electrodes 20ce, 30ce, 40ce, and 50ce may have a substantially flat upper surface to facilitate an electrical connection between the light emitting stacked structure and external lines or electrodes, as well as to increase the adhesiveness of the light emitting chip 100 to other elements, such as a PCB, during subsequent boding and transferring steps. The connection electrodes 20ce, 30ce, 40ce, and 50ce may surround the at least a portion of each light emitting stack 20, 30, and 40 to protect the light emitting stacked structure, such that the light emitting chip 100 has a more stable structure that can withstand various subsequent processes along with the passivation layer 90. For example, when the substrate 11 is removed from the light emitting chip 100 in a subsequent process according to an exemplary embodiment, the connection electrodes 20ce, 30ce, 40ce, and 50ce that substantially surround the light emitting stacked structure may absorb at least a part of the stress that would otherwise be applied directly to the light emitting stacked structure, thereby protecting the light emitting chip 100 during manufacture.

Figure 11:
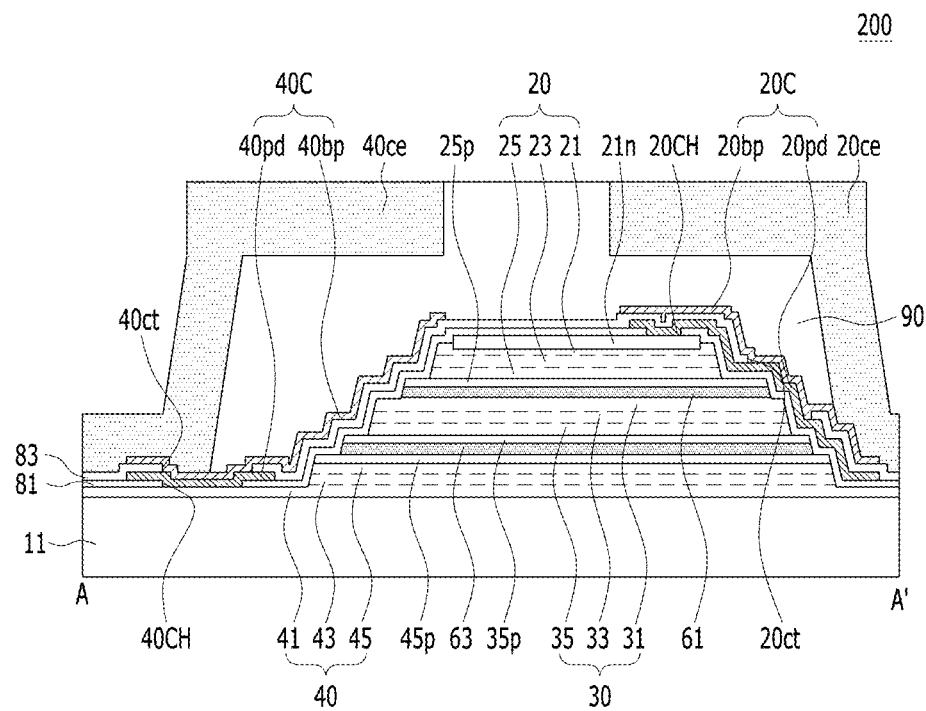
FIG. 11 is a cross-sectional view of a light emitting chip constructed according to another exemplary embodiment.

Although the drawings show that the passivation layer 90 is not formed between the portions of the connection electrodes 20ce, 30ce, 40ce, and 50ce that are disposed on a top surface of the passivation layer 90, however, the inventive concepts are not limited thereto. For example, referring to FIG. 11, in a light emitting chip 200 according to another exemplary embodiment, the passivation layer 90 may be formed between the connection electrodes 20ce, 30ce, 40ce, and 50ce that are disposed on a top surface of the passivation layer 90, such that the upper surface of the passivation layer 90 may be substantially flush with the upper surfaces of the connection electrodes 20ce, 30ce, 40ce, and 50ce. In this manner, the adhesiveness of the light emitting chip 200 to the PCB or the like may be further strengthened during subsequent processes. A portion of the passivation layer 90 that is disposed between the connection electrodes 20ce, 30ce, 40ce, and 50ce may be formed before or after forming the connection electrodes 20ce, 30ce, 40ce, and 50ce. Since the constituent elements of the light emitting chip 200 according to the illustrated exemplary embodiment are substantially the same as those of the light emitting chip 100 described above, repeated descriptions of the substantially the same elements will be omitted to avoid redundancy.

Figure 12:
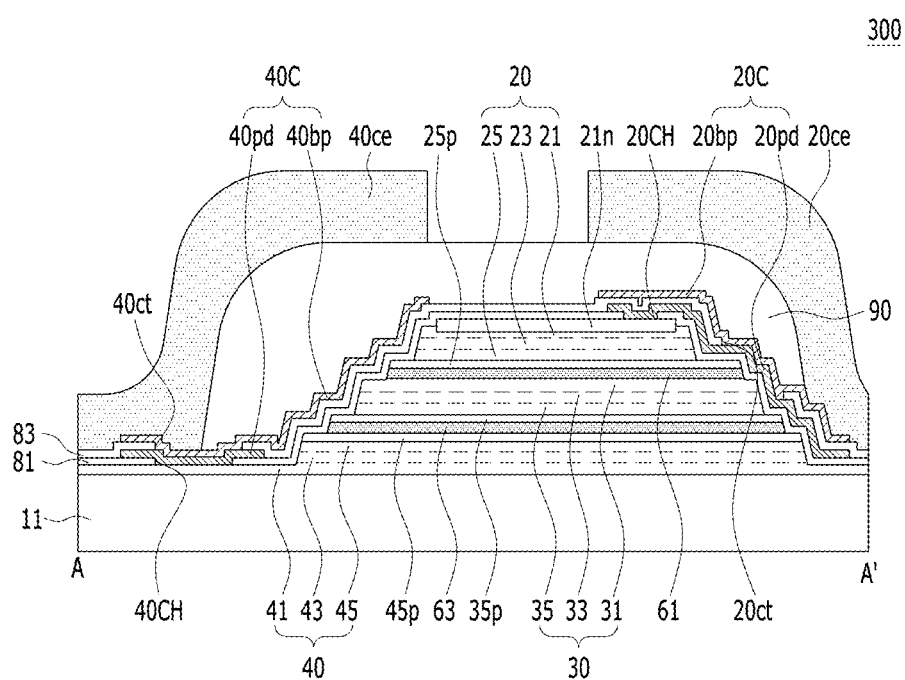
FIG. 12 is a cross-sectional view of a light emitting chip constructed according to still another exemplary embodiment.

Referring to FIG. 12, a light emitting chip 300 according to still another exemplary embodiment includes connection electrodes 20ce, 30ce, 40ce, and 50ce that have substantially curved shapes. According to the illustrated exemplary embodiment, the passivation layer 90 formed on the light emitting stacked structure may have a substantially rounded corners, such that the connection electrodes 20ce, 30ce, 40ce, and 50ce formed thereon may also be substantially rounded at corners thereof. In this manner, the connection electrodes 20ce, 30ce, 40ce, and 50ce may be more stably disposed on the passivation layer 90, as an interface therebetween forms a smooth angle, thereby improving the surface contact therebetween. Since the constituent elements of the light emitting chip 300 according to the illustrated exemplary embodiment are substantially the same as those of the light emitting chip 100 described above, repeated descriptions of the substantially the same elements will be omitted to avoid redundancy.

According to the illustrated exemplary embodiments, the third connection electrode 40ce is shown as being asymmetrical to the first connection electrode 20ce. More particularly, each of the connection electrodes 20ce, 30ce, 40ce and 50ce may have a portion that does not overlap the passivation layer 90, and FIGS. 11 and 12, for example, show that those of the third connection electrode 40ce to be greater in area than those of the first connection electrode 20ce near two opposing ends of the substrate 11. However, the inventive concepts are not limited thereto, and in some exemplary embodiments, each of the connection electrodes 20ce, 30ce, 40ce and 50ce may be symmetrical to each other. For example, a portion of each of the connection electrodes 20ce, 30ce, 40ce and 50ce that does not overlap the passivation layer 90 may have the same area as each other.

Figure 13:
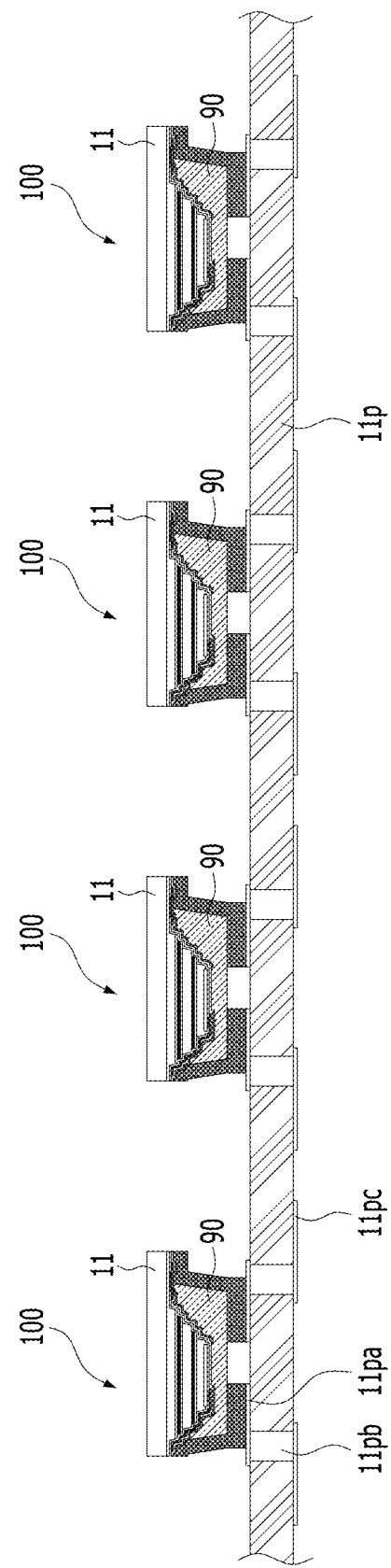
FIGS. 13, 14, and 15 are cross-sectional views illustrating a process of manufacturing a light emitting package according to an exemplary embodiment.
Figure 14:
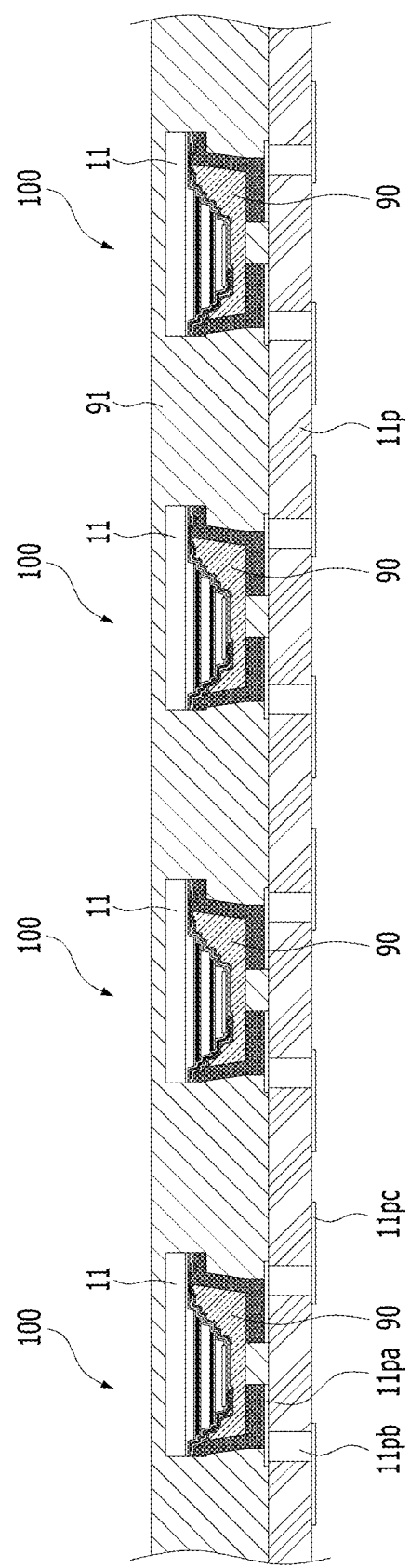
Figure 15:
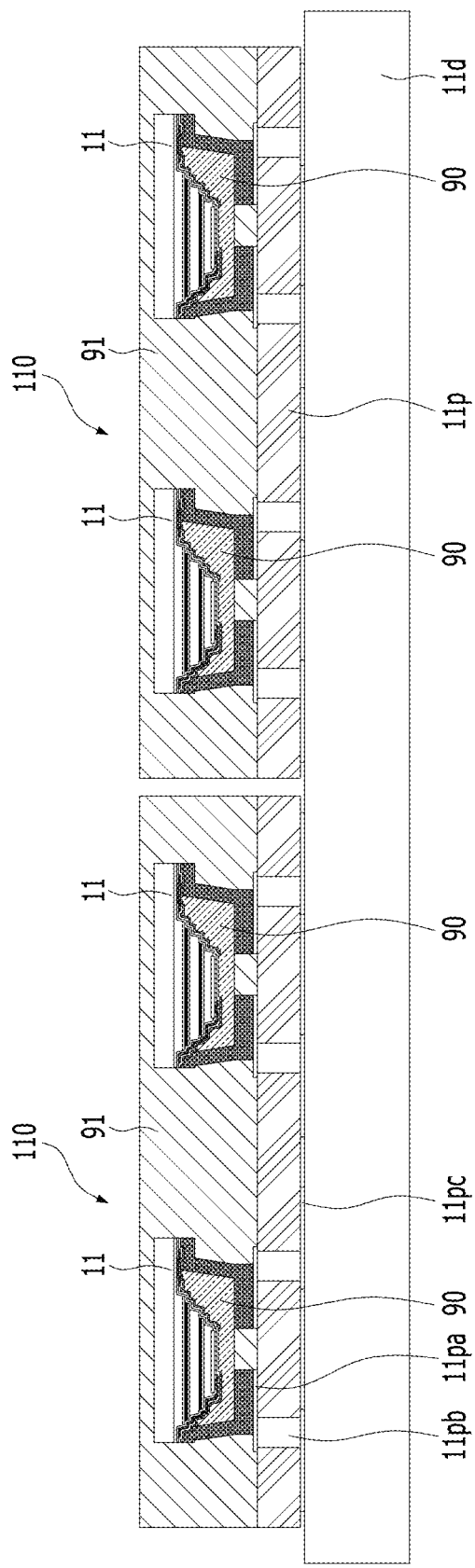

FIGS. 13, 14, and 15 are cross-sectional views schematically illustrating a process of manufacturing a light emitting package according to an exemplary embodiment.

An array of the light emitting chips 100 described above may be singularized by cutting the substrate 11, and each of the light emitting chips 100 may be transferred and be packaged via various methods known in the art.

Referring to FIG. 13, the light emitting chips 100 may be mounted on a circuit board 11p. According to an exemplary embodiment, the circuit board 11p may include upper circuit electrodes 11pa, lower circuit electrodes 11pc, and middle circuit electrodes 11pb disposed therebetween, which are electrically connected to each other. The upper circuit electrodes 11pa may correspond to each of the first, second, third, and fourth connection electrodes 20ce, 30ce, 40ce, and 50ce, respectively. According to an exemplary embodiment, the lower circuit electrodes 11pc of the light emitting chip 100 may be spaced apart from each other at a predetermined pitch, which may correspond to a pitch of electrodes of a final target device to which the light emitting chip 100 is to be mounted, such as a display device. In some exemplary embodiments, the upper circuit electrodes 11pa may be surface treated by ENIG, to facilitate electrical connection to the connection electrodes of the light emitting chip 100 by being partially melt at high temperature.

According to an exemplary embodiment, the first, second, third, and fourth connection electrodes 20ce, 30ce, 40ce, and 50ce of the light emitting chips 100 may be bonded to the upper circuit electrodes 11pa of the circuit board 11p, respectively, by an anisotropic conductive film (ACF) bonding, for example. When the light emitting chips 100 are bonded to the circuit board 11p through ACF bonding, which may be performed at a lower temperature than in other bonding methods, the light emitting chips 100 may be protected from being exposed to a high temperature during bonding. However, the inventive concepts are not limited to a particular bonding method. For example, in some exemplary embodiments, the light emitting chips 100 may be bonded to the circuit board 11p using an anisotropic conductive paste (ACP), solder, ball grid area (BGA), or micro bumps including at least one of Cu and Sn. In this case, since the upper surfaces of the connection electrodes 20ce, 30ce, 40ce, and 50ce may provide a wider contacting area from its curved shape, the adhesiveness of the light emitting chips 100 to an anisotropic conductive film may be increased, thereby forming a more stable structure when bonded to the circuit board 11p, and secure process margin during manufacture.

Referring to FIG. 14, a molding layer 91 is formed between the light emitting chips 100. According to an exemplary embodiment, the molding layer 91 may transmit a portion of light emitted from the light emitting chip 100, and may also reflect, diffract, and/or absorb a portion of external light to prevent the external light from being reflected by the light emitting chip 100 towards a direction that may be visible to a user. The molding layer 91 may cover at least a portion of the light emitting chip 100 to protect the light emitting chip 100 from external moisture and stress, for example. In this manner, together with the passivation layer 90 formed on the light emitting chip 100, the molding layer 91 may provide an additional protection to the light emitting package by further reinforcing its structure.

According to an exemplary embodiment, when the molding layer 91 covers a top surface of the substrate 11 facing away the circuit board 11p, the molding layer 91 may have a thickness less than about 100 μm to at least transmit 50% of light emitted from the light emitting chip 100. In an exemplary embodiment, the molding layer 91 may include an organic or an inorganic polymer. In some exemplary embodiments, the molding layer 91 may additionally include pillars, such as silica or alumina. In some exemplary embodiments, the molding layer 91 may include the same material as the passivation layer 90. The molding layer 91 may be formed through various methods known in the art, such as lamination, plating, and/or printing methods. For example, the molding layer 91 may be formed by a vacuum laminate process, in which an organic polymer sheet is disposed on the light emitting chip 100, and high temperature and pressure are applied in vacuum, to improve light uniformity by providing a substantially planar top surface of the light emitting package.

Referring to FIG. 15, the light emitting chips 100 formed on the circuit board 11p and covered with the molding layer 91 may be cut in a desired configuration to be formed as a light emitting package 110. For example, the light emitting package 110 may include a single light emitting chip 100 therein or may include a plurality of light emitting chips therein, such as in 2×2 arrangement. However, the inventive concepts are not limited to a particular number of light emitting chips formed in the light emitting package 110. For example, in some exemplary embodiments, the light emitting package 110 may include one or more light emitting chips 100 formed on the circuit board 11p. In addition, the inventive concepts are not limited to a particular arrangement of one or more light emitting chips 100 in the light emitting package 110. For example, one or more light emitting chips 100 in the light emitting package 110 may be arranged in n×m arrangement, where n and m are natural numbers. According to an exemplary embodiment, the circuit board 11p may include scan lines and data lines to independently drive each of the light emitting chips 100 included in the light emitting package 110.

Figure 16:
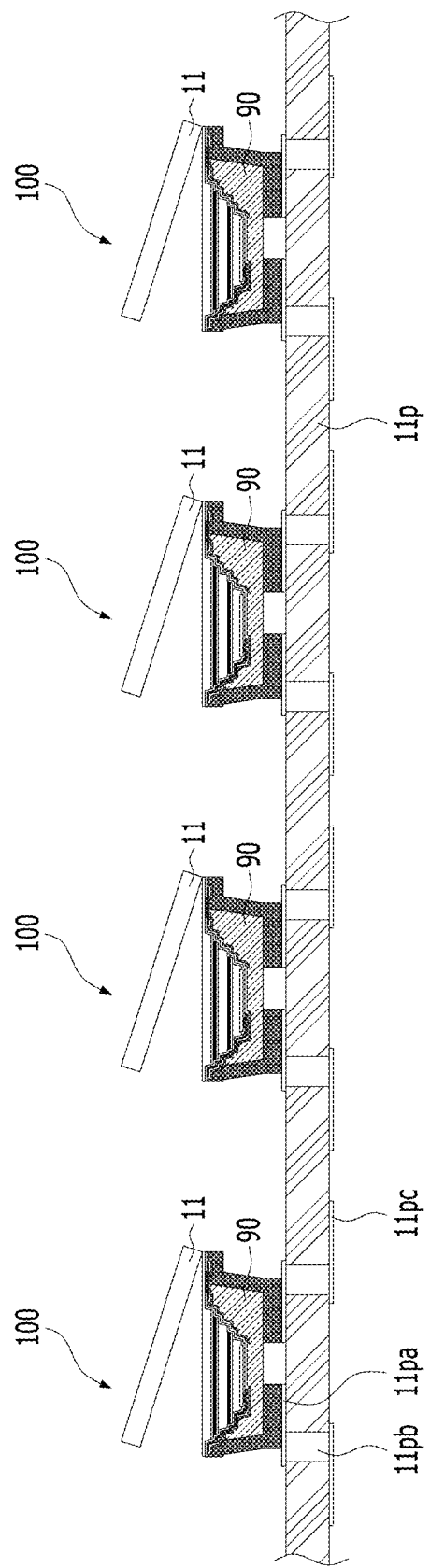
FIGS. 16 and 17 are cross-sectional views schematically illustrating a process of manufacturing a light emitting package according to another exemplary embodiment.

Referring to FIG. 16, the light emitting packages 110 may be mounted on a target substrate 11d of a final device, such as a display device. The target substrate 11d may include target electrodes corresponding to the lower circuit electrodes 11pc of the light emitting package 110, respectively. According to an exemplary embodiment, the display device may include a plurality of pixels, and each of the light emitting chips 100 may be disposed to correspond to each pixel. More particularly, each of the light emitting stacks of the light emitting chip 100 according to the exemplary embodiments may correspond to each sub-pixel of one pixel. Since the light emitting chip 100 includes vertically stacked light emitting stacks 20, 30, and 40, the number of chips that would need to be transferred for each sub-pixel may be substantially reduced than that in a conventional light emitting device. In addition, since the connection electrodes 20ce, 30ce, 40ce, and 50ce according to the exemplary embodiments are curved and substantially surrounds the passivation layer 90 covering the light emitting stacked structure, the light emitting chip 100 may be protected from external stress. Although the light emitting chips 100 have been described above as being mounted on the circuit board 11p, and then packaged to be mounted on a final device, such as a display panel, however, the inventive concepts are not limited thereto. For example, in some exemplary embodiments, the light emitting chips 100 may be covered with or without the molding layer 91, and may be directly mounted on the final device, such as a display panel.

Figure 17:
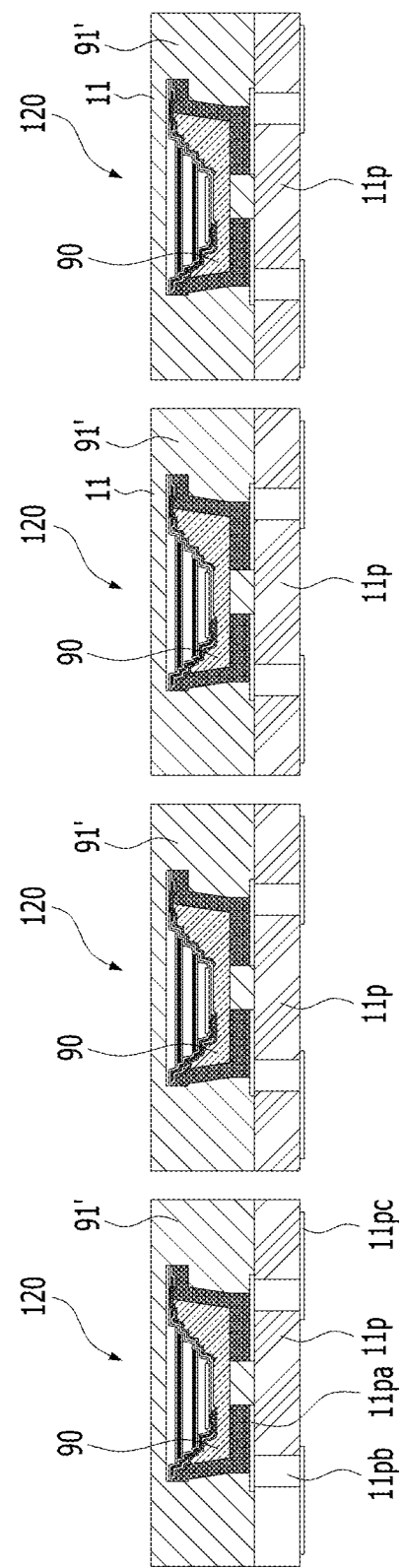

FIGS. 16 and 17 are cross-sectional views schematically illustrating a process of manufacturing a light emitting package according to another exemplary embodiment.

Referring back to FIG. 13, according to another exemplary embodiment, the substrate 11 attached on the light emitting chips 100 may be removed, as shown in FIG. 16, by a laser lift off (LLO) process, chemical process, mechanical process, or the like. In this case, since the light emitting chips 100 constructed according to the principles of the invention have a reinforced internal structure as described above, the light emitting stacked structures included in the light emitting chips 100 may be protected from external stress even when the substrate 11 is removed.

According to an exemplary embodiment, when the substrate 11 is a patterned sapphire substrate, concave-convex portions may be formed on the first-type semiconductor layer 41 of the third light emitting stack 40 that contacted the substrate 11 to improve light efficiency. In another exemplary embodiment, concave-convex portions may be formed on the first-type semiconductor layer 41 of the third light emitting stack 40 by etching or patterning, as known in the art.

Referring to FIG. 17, a molding layer 91' is formed between the light emitting chips 100, and the light emitting chips 100 may be cut in a desired configuration to provide a light emitting package 120. According to an exemplary embodiment, the molding layer 91' may cover the light emitting chip 100. The molding layer 91' is substantially the same as the molding layer 91 described above, and the arrangements of the light emitting chips 100 in the light emitting package 120 are substantially same as the light emitting package 110 described above, and thus, repeated descriptions thereof will be omitted to avoid redundancy.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:
1. A light emitting chip, comprising:
a first LED sub-unit;
a second LED sub-unit disposed under the first LED sub-unit;

a third LED sub-unit disposed under the second LED sub-unit;
a passivation layer disposed on the first to third LED sub-units; and
a first connection electrode disposed on the passivation layer and electrically connected to at least one of the first, second, and third LED sub-units,
wherein the first connection electrode is continuously disposed over the side surfaces of the first to third LED sub-units,
wherein the first connection electrode and the third LED sub-unit form a first angle defined between an upper surface of the third LED sub-unit and an inner surface of the first connection electrode disposed over the side surfaces of the first to third LED sub-units,
wherein the first angle is greater than 0° and less than about 80°, and
wherein the first connection electrode is spaced apart from a top surface of the first LED sub-unit.

2. The light emitting chip of claim 1, wherein the first angle is greater than about 60° and less than about 70°.

3. The light emitting chip of claim 1, wherein the passivation layer and the third LED sub-unit form a second angle defined between the upper surface of the third LED sub-unit and an inner surface of the passivation layer that is less than about 80°.

4. The light emitting chip of claim 1, wherein the first connection electrode has at least one surface having a curved shape.

5. The light emitting chip of claim 4, wherein:
the passivation layer has a top surface facing the first LED sub-unit and a side surface intersecting the top surface; and
the first connection electrode contacts at least a portion of each of the top surface and the side surface of the passivation layer.

6. The light emitting chip of claim 5, wherein the first connection electrode contacts at least a portion of a top surface of the third LED sub-unit.

7. The light emitting chip of claim 1, wherein the first connection electrode overlaps at least a portion of each of the first, second, and third LED sub-units in a plan view.

8. The light emitting chip of claim 1, wherein at least a portion of the passivation layer is exposed by the first connection electrode.

9. The light emitting chip of claim 1, wherein the passivation layer exposes at least a portion of a side surface of the third LED sub-unit.

10. The light emitting chip of claim 1, wherein the passivation layer covers side surfaces of the first and second LED sub-units.

11. The light emitting chip of claim 1, wherein the passivation layer exposes at least a portion of a top surface of the third LED sub-unit.

12. The light emitting chip of claim 1, further comprising:
a second connection electrode electrically connected to the first LED sub-unit;
a third connection electrode electrically connected to the second LED sub-unit; and
a fourth connection electrode electrically connected to the third LED sub-unit,
wherein:
the first connection electrode is electrically connected to each of the first, second, and third sub-units; and
each of the first, second, third, and fourth connection electrodes has a curved shape.

13. The light emitting chip of claim 12, wherein:
each of the first, second, third, and fourth connection electrodes has a first portion disposed on a top surface of the passivation layer; and
the passivation layer is not disposed between the first portions of at least one of the first, second, third, and fourth connection electrodes.

14. The light emitting chip of claim 1, further comprising a substrate,
wherein:
the first LED sub-unit comprises a first LED light emitting stack;
the second LED sub-unit comprises a second LED light emitting stack;
the third LED sub-unit comprises a third LED light emitting stack; and
the first, second, and third LED light emitting stacks have successively larger regions overlapping with the substrate.

15. The light emitting chip of claim 14, wherein at least one of the light emitting stacks comprises a micro LED having a surface area less than about 10,000 square μm.

16. The light emitting chip of claim 1, wherein the passivation layer has a substantially black color and comprises a photo-sensitive material.

17. A light emitting chip, comprising:
a substrate having a substantially rectangular shape with a plurality of corners;
a first LED sub-unit disposed on the substrate;
a second LED sub-unit disposed between the first LED sub-unit and the substrate;
a third LED sub-unit disposed between the second LED sub-unit and the substrate;
a passivation layer disposed on the substrate and covering the first to third LED sub-units; and
a first connection electrode electrically connected to at least one of the first, second, and third LED sub-units,
wherein the passivation layer exposes portions of the third LED sub-unit near each of the plurality of corners of the substrate.

18. The light emitting chip of claim 17, wherein the first connection electrode has a first portion contacting at least a portion of the third LED sub-unit and a second portion contacting at least a portion of a top surface of the passivation layer disposed furthest away from the substrate.

19. The light emitting chip of claim 17, wherein the first connection electrode and the third LED sub-unit form an angle defined between an upper surface of the third LED sub-unit and an inner surface of the first connection electrode,
wherein the angle is greater than 0° and less than about 80°.

20. The light emitting chip of claim 17, wherein the first connection electrode is connected to each of the first, second, and third LED sub-units at one corner of the substrate exposed by the passivation layer.

* * * * *